United States Patent [19]
Oka et al.

[11] Patent Number: 5,705,957
[45] Date of Patent: Jan. 6, 1998

[54] TEMPERATURE-COMPENSATED PIEZOELECTRIC OSCILLATOR

[75] Inventors: Manabu Oka; Masayuki Kikushima; Kazunari Ichinose, all of Suwa, Japan

[73] Assignee: Seiko Epson Corporation, Tokyo, Japan

[21] Appl. No.: 638,558

[22] Filed: Apr. 26, 1996

[30] Foreign Application Priority Data

Apr. 27, 1995 [JP] Japan .................................. 7-104011
Mar. 18, 1996 [JP] Japan .................................. 8-061493

[51] Int. Cl.$^6$ .................................. H03B 5/36; H03B 5/04; H01L 1/02
[52] U.S. Cl. .................. 331/66; 331/68; 331/108 D; 331/158; 331/177 R
[58] Field of Search ............................ 331/66, 68, 108 C, 331/116 R, 116 PE, 158, 176, 177 R, 186, 108 D

[56] References Cited

U.S. PATENT DOCUMENTS

| | | | |
|---|---|---|---|
| 4,746,879 | 5/1988 | Ma et al. | 331/66 X |
| 5,053,726 | 10/1991 | Christopher et al. | 331/158 X |
| 5,075,643 | 12/1991 | Einbinder | 331/185 X |
| 5,081,431 | 1/1992 | Kuichi et al. | 33/158 |
| 5,097,228 | 3/1992 | McJunkin | 331/185 X |
| 5,241,286 | 8/1993 | Mirow | 331/176 X |

FOREIGN PATENT DOCUMENTS

| | | |
|---|---|---|
| A-42 09 843 | 11/1993 | Germany . |
| A-56 016891 | 2/1981 | Japan . |
| A-63 252004 | 10/1988 | Japan . |
| A-03 183904 | 1/1991 | Japan . |

*Primary Examiner*—David Mis
*Attorney, Agent, or Firm*—Oliff & Berridge

[57] ABSTRACT

This invention provides a temperature-compensated piezoelectric oscillator having an oscillation frequency that is easily adjusted in an adjustment procedure after its assembly. Compensation for frequency-temperature characteristics is achieved without the need for an externally installed variable reactance element. The temperature-compensated piezoelectric oscillator includes a piezoelectric oscillator element and an oscillator circuit that drives the piezoelectric oscillator element. The oscillator circuit changes the oscillation frequency in response to an applied power supply voltage VDD(T). A temperature sensor circuit senses the ambient temperature T of the piezoelectric oscillator element. A variable power supply circuit changes the power supply voltage VDD(T) applied to the oscillator circuit in response to the temperature sensed by the temperature sensor circuit. The changes in the applied power supply voltage VDD(T) changes the frequency-temperature characteristics of the oscillator circuit.

18 Claims, 29 Drawing Sheets

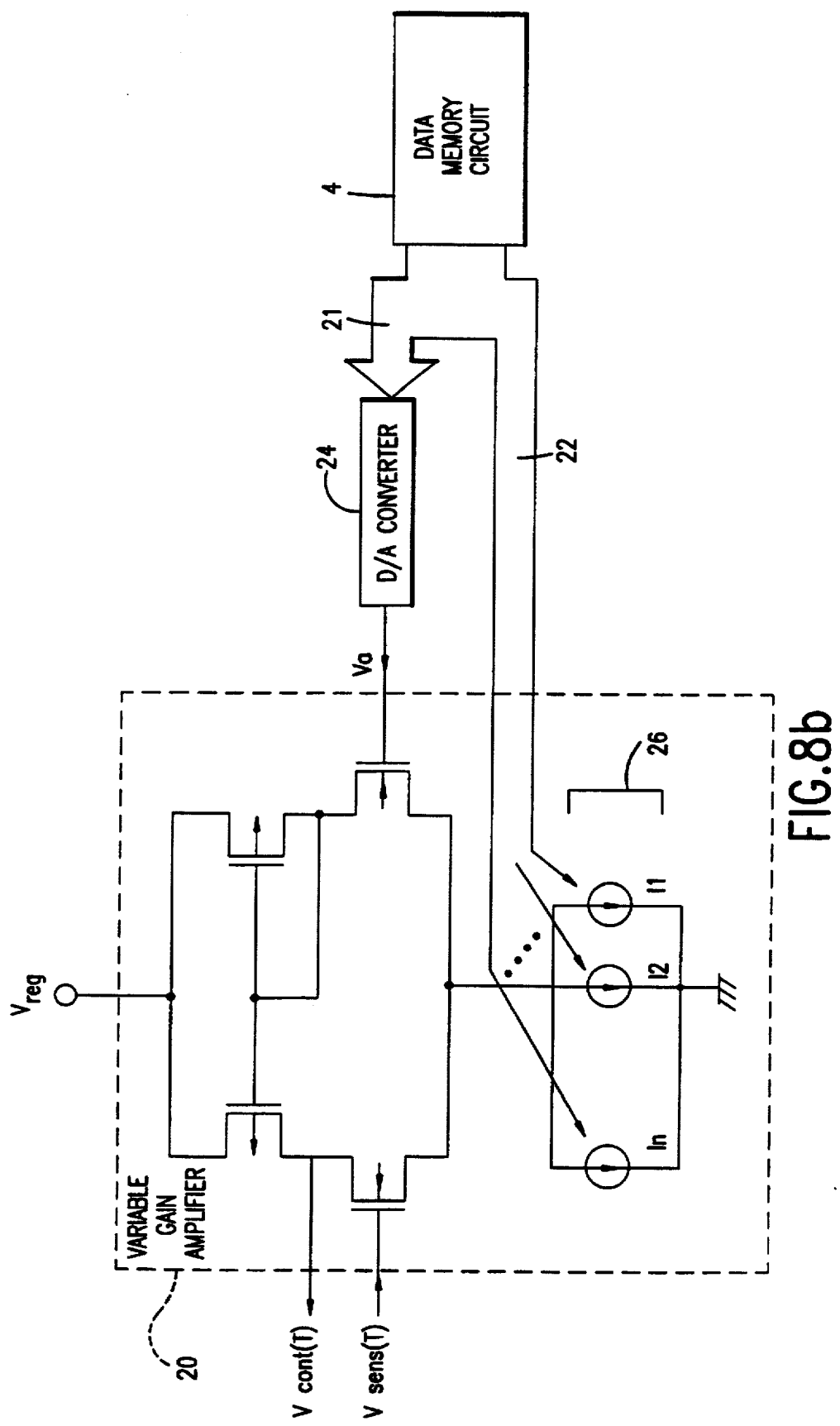

TEMPERATURE-COMPENSATED PIEZOELECTRIC OSCILLATOR

BACKGROUND OF THE INVENTION

1. Field of the Invention

The present invention relates to a temperature-compensated piezoelectric oscillator for use in a reference frequency source for communications equipment or the like.

2. Description of Related Art

The analog temperature-compensated piezoelectric oscillator shown in FIG. 22(a) has conventionally been used as a piezoelectric oscillator circuit for compensating for frequency variations due to temperature. For example, Japanese Patent Application Publication No. Shou-4-1969 discloses a circuit having such a construction. As shown in the figure, a temperature-compensated piezoelectric oscillator 100 comprises a piezoelectric oscillator element 9, a Colpitts-type oscillator circuit for driving a piezoelectric oscillator element 9, and a temperature compensating circuit network 101 for compensating for frequency-temperature characteristics.

A temperature-compensating circuit network 101 is constructed by connecting a high-temperature compensating circuit 101a and a low-temperature compensating circuit 101b in series connection, as shown in FIG. 22(b). The high-temperature compensating circuit 101a is made by connecting a thermistor RTH (T) and a high-temperature side temperature characteristic adjustment resistor RCH in series connection, and then by connecting the thermistor RTH(T) and the resistor RCH in parallel with a capacitor CH, and the low-temperature compensating circuit 101b is made by connecting a thermistor RTL(T), a low-temperature side temperature characteristic adjustment resistor RCL, and a capacitor CL in parallel connection. In this arrangement, the temperature-compensating circuit network 101 keeps the frequency of the output fout of a Colpitts-type oscillator circuit 108, namely, the oscillation frequency of the temperature-compensated piezoelectric oscillator 100 within a predetermined range, by changing the reactance characteristics of the Colpitts-type oscillator circuit 108 to offset the frequency-temperature characteristics of the piezoelectric oscillator element 9 in a manner that the frequency-temperature characteristics of a piezoelectric oscillator element 9, for example cubic characteristics (refer to FIG. 3) of the AT cut crystal oscillator is compensated for. As shown in FIG. 23, these circuits are soldered on both the top and bottom sides of a circuit board 143, and then they are all mounted on a resin base 144 and then housed in a metal cover 145.

FIG. 24 is another example of the prior art temperature-compensated piezoelectric oscillator, showing the construction of the temperature-compensated piezoelectric oscillator in which the frequency change due to the temperature of an oscillator is digitally compensated for. As shown, this temperature-compensated piezoelectric oscillator 200 comprises a temperature sensor circuit 2 for sensing the ambient (environmental) temperature T and outputting a voltage Vsens(T) in response to the sensed temperature, an A/D converter 52 for converting the voltage Vsens(T) into digital temperature data, a data memory circuit 204 for outputting temperature characteristic compensating data in response to the temperature data, a D/A converter 253 for converting the temperature characteristic compensating data into control voltage Vcont(T) and outputting it, and an oscillator circuit 119, whereby the control voltage Vcont(T) responsive to the ambient temperature T is entered to the oscillator 119. The temperature characteristic compensating data is beforehand stored in a data memory circuit 204 via an fO temperature characteristic adjustment circuit 11 that is connected from the outside and an internal data input/output circuit 10 when the temperature-compensated piezoelectric oscillator 200 is at its adjustment stage after its assembly during manufacturing.

As shown in FIG. 24 and FIG. 25, further connected to the oscillator circuit 119 are the piezoelectric oscillator element 9, a voltage regulator circuit 3, an fO adjustment circuit 7, a variable reactance element 202, and an output buffer 12. The fO adjustment circuit 7 is the circuit for adjusting a reference frequency fO according to frequency setting data in the data memory circuit 204, and the frequency setting data, as the data used to adjust the frequency deviation due to manufacturing variations of the piezoelectric oscillator element 9, is beforehand stored into the data memory circuit 204 through the fO temperature characteristic adjustment circuit 11 and the internal data input/output circuit 10 in the same way as the temperature characteristic compensating data is stored. The variable reactance element 202 is the element which changes its reactance characteristics in response to the control voltage Vcont(T) and offsets the frequency-temperature characteristics of the piezoelectric oscillator element 9, and the oscillation frequency of the temperature-compensated piezoelectric oscillator 200 is kept to within a predetermined range by the variable reactance element 202. The temperature-compensated piezoelectric oscillator 200, as shown in FIG. 26, may be constituted by the piezoelectric oscillator element 9, the variable reactance element 202, and a temperature-compensated oscillator IC 241 into which the rest of the circuitry is integrated, and these three components are mounted on a lead frame 242, and then packaged integrally into a plastic mold 240.

In the temperature-compensated piezoelectric oscillator 100 and the temperature-compensated piezoelectric oscillator 200, to compensate for the frequency-temperature characteristics, namely, to achieve a high-accuracy frequency characteristic, reactance needs to be precisely changed in response to the ambient temperature T, and to this end, the circuit or the oscillator is installed external to the oscillator circuit 108 or 119.

Generally, the temperature-compensated piezoelectric oscillator 100 employs bipolar transistors which exhibit wide frequency characteristics compared to CMOS, and along with these, resistors and thermistors of a high resistance and a high accuracy and capacitors of a large capacitance and a high accuracy are used. Generally speaking, these components are difficult to be integrated into an IC structure, and thus there is no choice but to use these components in their discrete form in the temperature-compensated piezoelectric oscillator 100, and a large component count results, presenting difficulty in miniaturization of the oscillator. Since each component is soldered onto a circuit board 143, mounting through reflow is impossible. Furthermore, when temperature characteristics adjustment is performed, temperature characteristic adjustment resistors RCH, RCL need to be temporarily installed, and after checking the temperature characteristics of each component, the temporarily installed resistors RCH, RCL have to be replaced with permanent temperature characteristic adjustment resistors RCH and RCL, and thus the adjustment procedure is clumsy, and this serves as a factor that contributes to lowering production efficiency.

On the other hand, in the temperature-compensated piezoelectric oscillator 200, frequency characteristic adjustment procedure is easily done by storing beforehand the temperature characteristic compensating data and the frequency setting data in the data memory circuit 204, and the oscillator is made up of no more than the piezoelectric oscillator element 9, the variable reactance element 202 and the temperature-compensated oscillator IC 241, and thus miniaturization is promoted to some extent. In the temperature-compensated piezoelectric oscillator 200, however, the variable reactance element 202, typically a varicap diode, is required, and this variable reactance element 202 is difficult to integrate into a CMOS IC as each component of the temperature-compensated piezoelectric oscillator 100 is, and even if the variable reactance element 202 is integrated, compensating for the frequency-temperature characteristic in a precise manner is difficult, because an integrated element is greatly outperformed in linearity and variable range by an external variable reactance element.

Although it is contemplated that a circuit identical to the fO adjustment circuit 7 is used instead of the variable reactance element 202, this arrangement is not practicable, because, different from compensating for variations of the elements at their initial setting, noise is generated due to instantaneous change of the bits of the temperature characteristic compensating data when it changes in response to the ambient temperature T. Namely, the temperature-compensated piezoelectric oscillator 200 essentially needs an externally installed variable reactance element 202, and this serves as a limiting factor for miniaturization, and contributes to a higher cost for components and their mounting.

SUMMARY OF THE INVENTION

The present invention has been developed to resolve the above problem, and it is an object of the present invention to provide a temperature-compensated piezoelectric oscillator that is easily IC packaged and easily adjusted in an adjustment procedure after its assembly, and furthermore compensates for frequency-temperature characteristics without the need for externally installing a variable reactance element.

A temperature-compensated piezoelectric oscillator comprises a piezoelectric oscillator element having frequency-temperature characteristics, an oscillator circuit for driving the piezoelectric oscillator element and for changing the oscillation frequency in response to an applied power supply voltage, a temperature sensor circuit for sensing the ambient temperature of the piezoelectric oscillator element, and a variable power supply circuit for feeding to the oscillator circuit the applied power supply voltage that changes the frequency-temperature characteristics in response to the sensed temperature by the temperature sensor circuit.

In this arrangement, even when the oscillation frequency of the piezoelectric oscillator element varies in response to the ambient temperature, the applied power supply voltage fed to the oscillator circuit is designed to change in response to the ambient temperature, the oscillation frequency is changed in response to the change of the applied power supply voltage, and therefore the oscillation frequency resulting from the entire oscillator is kept to within a predetermined range by offsetting the frequency-temperature characteristics of the piezoelectric oscillator. Furthermore, since by changing the applied power supply voltage, the frequency-temperature characteristics are compensated for, the external installation of a variable reactance element to the oscillator circuit, as required in the prior art, is not necessary any more. This arrangement allows each circuit element of the temperature-compensated piezoelectric oscillator to be easily integrated in CMOS process, and thus IC packaging of the temperature-compensated piezoelectric oscillator is easier.

A variable power supply circuit comprises data memory means for storing in response to the ambient temperature the temperature characteristic compensating data that offsets the frequency-temperature characteristics. The variable power supply circuit preferably changes the applied power supply voltage in response to the corresponding temperature characteristic compensating data that is read from the data memory means in response to the sensed temperature.

In the above arrangement, since the temperature characteristic compensating data is read in response to the ambient temperature and the applied power supply voltage is changed according to the temperature characteristic compensating data, the applied power supply voltage for offsetting the frequency-temperature characteristics of the piezoelectric oscillator element is easily generated.

When the frequency-temperature characteristics are approximated by a function $f(T)=A(T-25)+B(T-25)^2+C(T-25)^3$ using the ambient temperature T, a linear coefficient A, a quadratic coefficient B and a cubic coefficient C, the variable power supply circuit preferably comprises data memory means for storing the temperature characteristic compensating data that is set to offset at least one of the frequency changes associated with the linear coefficient A, the quadratic coefficient B and the cubic coefficient C. The variable power supply circuit, based on the temperature characteristic compensating data read from the data memory means, changes the applied power supply voltage to offset the frequency change that follows the function $f(T)$.

In the above arrangement, the temperature characteristic compensating data is read, and based on the temperature characteristic compensating data, the applied supply voltage that offsets at least one of the frequency changes associated with the linear coefficient A, the quadratic coefficient B and the cubic coefficient C is easily generated.

The temperature characteristic compensating data preferably includes a coefficient G and an additional constant H, which define a linear function $V(T)=G(T)+H$. The variable power supply circuit reads the multiplication coefficient G and the additional constant H, while changing the applied power supply voltage so that the frequency change associated with the linear coefficient A is offset based on the linear function $V(T)$.

In the above arrangement, the multiplication coefficient G and the additional constant H stored as the temperature characteristic compensating data are read, and based on the multiplication coefficient G and the additional constant H, the applied power supply voltage that offsets the frequency change associated with the linear coefficient A is easily generated. Since in this case, the temperature characteristic compensating data stored in the data memory means, when at its minimum data quantity, is no more than the multiplication coefficient G and the additional constant H, the data memory means having a small memory capacity works, and thus, the temperature-compensated piezoelectric oscillator is further miniaturized.

The temperature-compensated piezoelectric oscillator preferably further comprises data input means that allows data to be fed to the data memory means from outside of the temperature-compensated piezoelectric oscillator.

Since in the above arrangement, data such as the temperature characteristic compensating data is fed from the outside after the manufacturing of the temperature-compensated piezoelectric oscillator, there is no need for replacement of each internal circuit element, and circuit characteristic difference due to manufacturing variations is adjusted on an individual basis. Namely, an integrated temperature-compensated piezoelectric oscillator in an IC package results in permitting mass production, reducing manufacturing cost, and facilitating adjustment procedures after assembly.

The data memory means holds frequency setting data that is set to compensate for the reference oscillation frequency of the piezoelectric oscillator element at a reference temperature. The variable power supply circuit preferably compensates for the reference oscillation frequency based on the frequency setting data read out from the data memory means.

For example, there are times when the reference oscillation frequency of the piezoelectric oscillator element used in the temperature-compensated piezoelectric oscillator deviates due to manufacturing variations. In such a case, with the above arrangement, the deviation of the reference oscillation frequency is easily compensated based on the frequency setting data associated with the piezoelectric oscillator element, and thus the accuracy of the oscillation frequency is increased. If the frequency setting data is allowed to be modified after the temperature-compensated piezoelectric oscillator is assembled, the adjustment of the oscillation frequency is easily performed in the mass-produced IC piezoelectric oscillators after they are assembled.

The variable power supply circuit preferably raises the applied power supply voltage as the sensed temperature rises. Generally, the oscillator circuit tends to have a narrow oscillation margin and an increased oscillation cutoff voltage at a high temperature. With the above arrangement, however, an oscillation margin is assured even at a high temperature since the applied power supply voltage is increased in response to the rise of the ambient temperature.

The variable power supply circuit preferably comprises a limiter circuit that limits the range of change of the applied power supply voltage. The limiter circuit limits the applied power supply voltage fed to the oscillator circuit to a predetermined range of change.

The upper limit of the range of change is preferably set to a voltage lower than the power supply voltage fed to the temperature-compensated piezoelectric oscillator. Since the limiter circuit limits the applied power supply voltage fed to the oscillator circuit to the voltage lower than the power supply voltage to the temperature-compensated piezoelectric oscillator, the oscillator circuit remains insusceptible to the fluctuations of the power supply of the temperature-compensated piezoelectric oscillator and thereby makes a stabler oscillator circuit.

The lower limit of the range of change is preferably set to a voltage higher than the oscillation cutoff voltage of the oscillator circuit. Since the limiter circuit limits the applied power supply voltage to the oscillator circuit to the voltage higher than the oscillation cutoff voltage, a stable temperature-compensated piezoelectric oscillator free from oscillation interruption results.

Components other than the piezoelectric oscillator element are preferably integrated into a one-chip IC. The temperature-compensated piezoelectric oscillator is miniaturized and adapted to mass production.

The one-chip IC is preferably packaged along with the piezoelectric oscillator element into a mold. For example, the temperature-compensated piezoelectric oscillator is packaged into a resin mold such as a plastic mold to miniature the entire oscillator and adapted to mass production, and thereby an easy-to-handle temperature-compensated piezoelectric oscillator results.

The one-chip IC is preferably housed along with the piezoelectric oscillator element into a package. The entire temperature-compensated piezoelectric oscillator is housed in a package such as a ceramic package, and is thus miniaturized and adapted to mass production as the temperature-compensated piezoelectric oscillator and thereby an-easy-to-handle temperature-compensated piezoelectric oscillator results.

BRIEF DESCRIPTION OF THE DRAWINGS

The invention is described in detail with reference to the following drawings, wherein like numerals represent like elements:

FIGS. 8(a) and 8(b) are the diagram showing the circuit of the variable gain amplifier;

DETAILED DESCRIPTION OF PREFERRED EMBODIMENTS

Referring now to the attached drawings, the temperature-compensated piezoelectric oscillator according to an embodiment of the present invention is discussed.

Figure 1:
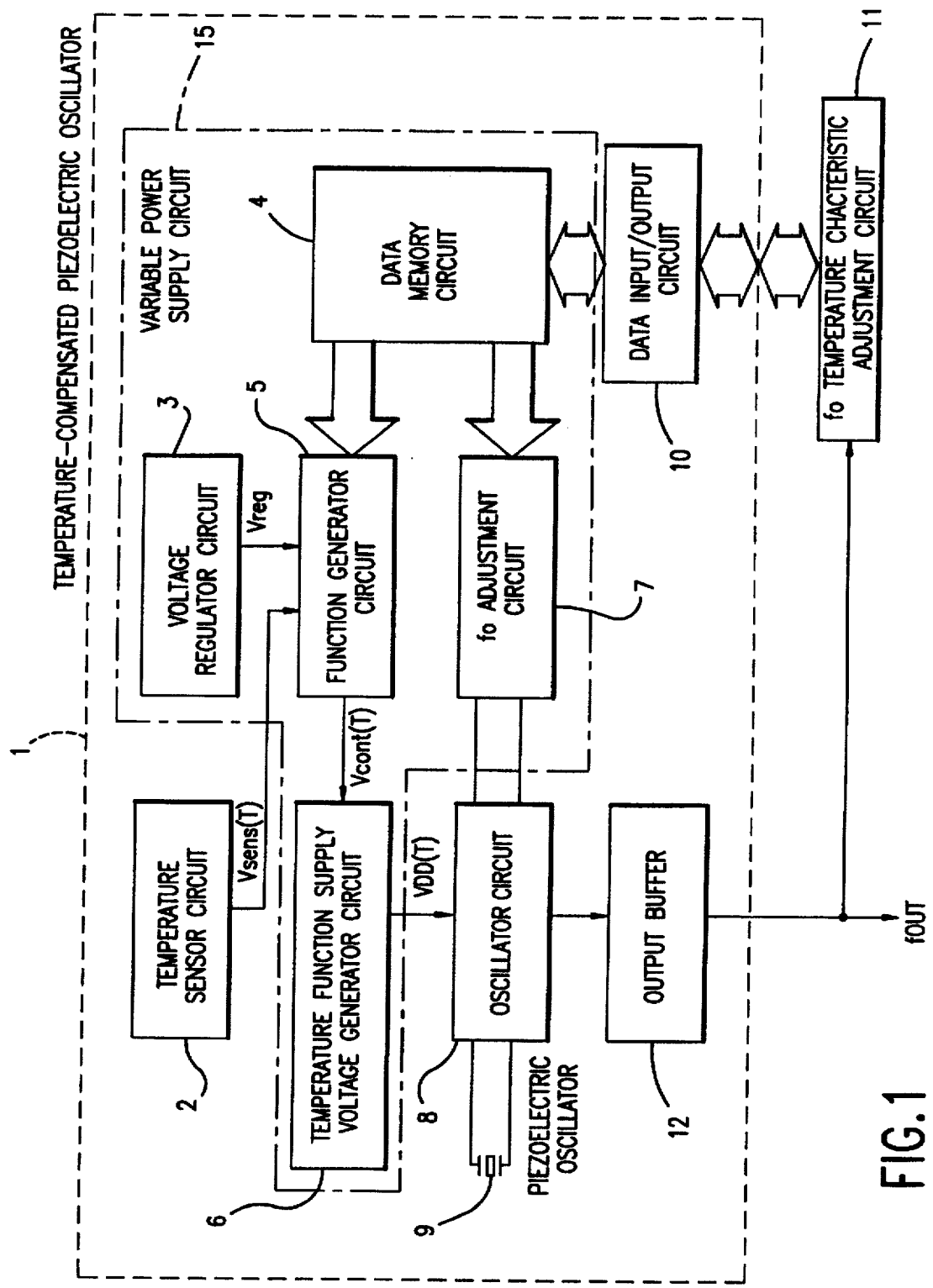
FIG. 1 is the block diagram showing the temperature-compensated piezoelectric oscillator according to an embodiment of the present invention.

FIG. 1 is the block diagram showing the temperature-compensated piezoelectric oscillator of this embodiment. The temperature-compensated piezoelectric oscillator 1 comprises a temperature sensor circuit 2, an oscillator circuit 8, a piezoelectric oscillator element 9, an output buffer 12, a variable power supply circuit 15, and a data input/output circuit (data input means) 10. The temperature-compensated piezoelectric oscillator 1, when in adjustment step after assembly, is designed to connect to fO temperature characteristic adjustment circuit 11.

Figure 2:
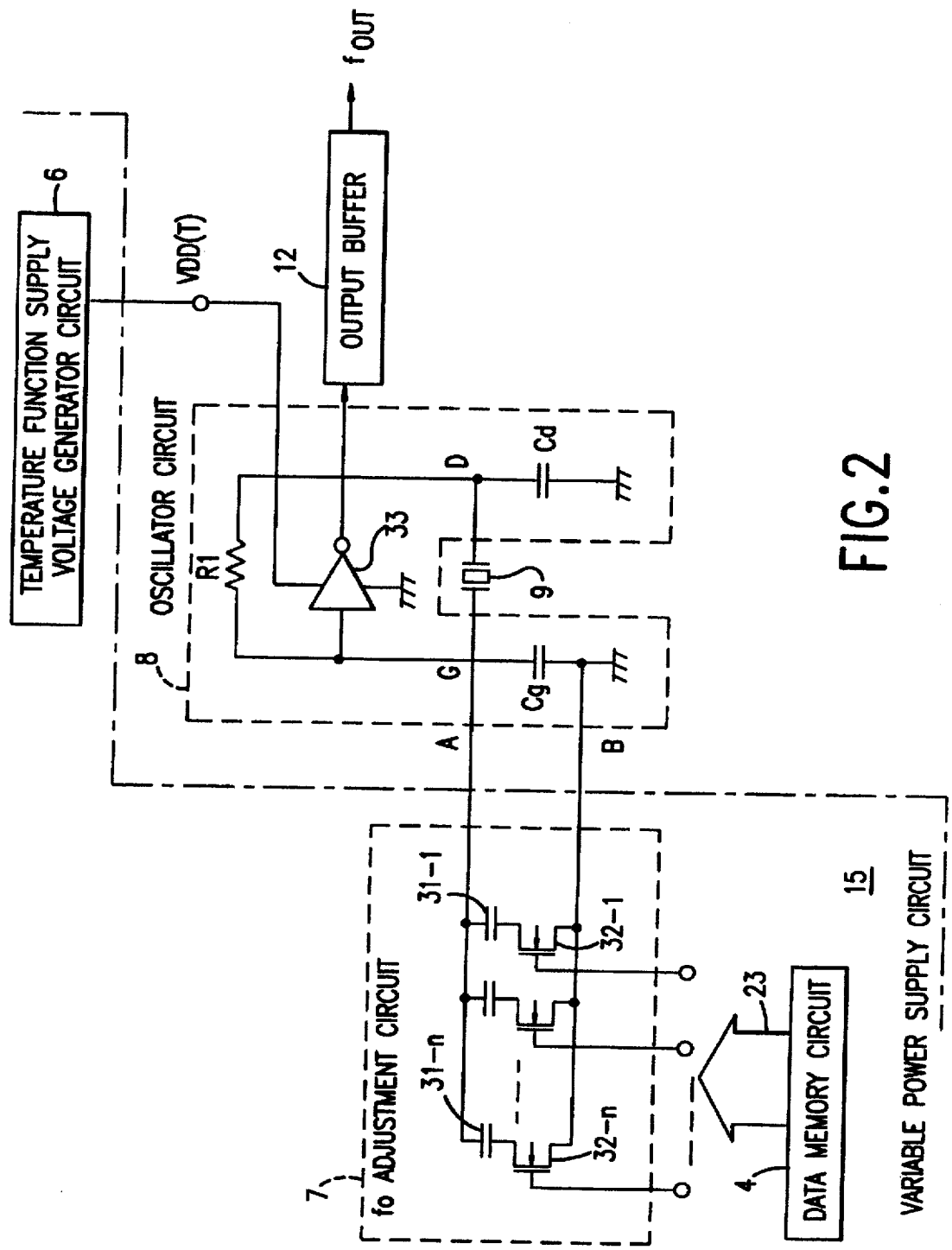
FIG. 2 is the diagram showing the example of the connection between the oscillator circuit and its peripheral circuits, and the construction of the oscillator circuit.

As shown in FIG. 2, the electrodes at both ends of the piezoelectric oscillator element 9 are connected to junction G and junction D of the oscillator circuit 8, namely the gate and the drain of a CMOS inverter 33. The piezoelectric oscillator element 9 is constructed of a commonly used AT cut crystal oscillator, and has frequency-temperature characteristic denoted by a curve (a) in FIG. 3. The frequency-temperature characteristic is approximated by the following polynomial, $$\Delta f/fO = A(T-25) + B(T-25)^2 + C(T-25)^3 \quad (1)$$

where T represents the ambient temperature, fO represents an oscillation frequency (hereinafter referred to as "reference frequency") at 25° C. (hereinafter referred to as "reference temperature"), and $\Delta f/fO$ represents a frequency deviation.

Figure 3:
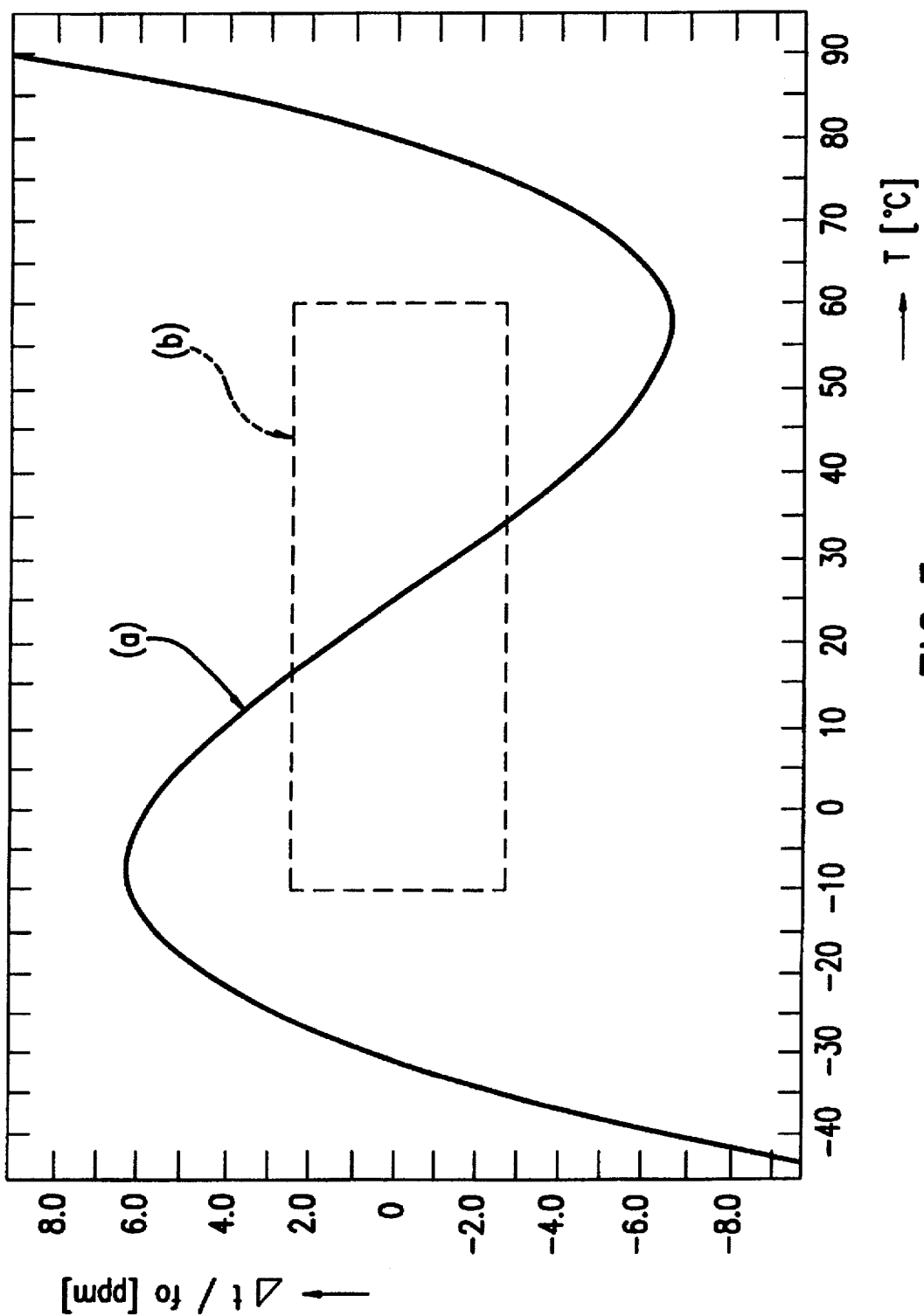
FIG. 3 is the diagram showing the example of the frequency-temperature characteristics of the piezoelectric oscillator element of AT cut crystal oscillator.

To keep a target frequency-temperature characteristic to within about ±2.5 [ppm] (hereinafter referred to as "target range") over a temperature range of about −10−+60 [° C.] as shown by the dotted box (b) in FIG. 3, each component of the temperature-compensating piezoelectric oscillator 1 to be described below is set to offset the variation of the frequency deviation $\Delta f/fO$ arising from the linear coefficient A of the equation (1), namely, the variation of the frequency deviation $\Delta f/fO$ that changes rightward downwardly inclined with the increase of the ambient temperature T.

As shown in FIG. 2, the oscillator circuit 8 comprises a CMOS inverter 33, a negative feedback resistor Rf of the CMOS inverter 33 from its drain to its gate, a capacitor Cg that determines the reactance characteristic of the input side, namely of the gate side of the CMOS inverter 33, and a capacitor Cd that determines the reactance characteristic of the output side, namely of the drain side. Also, as shown in FIG. 1 and FIG. 2, connected to the CMOS inverter 33 is a temperature function supply voltage generator circuit 6 of the variable power supply circuit 15 that feeds supply voltage (applied power supply voltage) VDD(T) to the CMOS inverter 33, and connected to the junction G at the gate side is the fO adjustment circuit 7 for adjusting the reference frequency fO, and connected to the junction D at the drain side is an output buffer 12 that reinforces driving power of the output and provides isolation to the oscillator circuit 8.

Figure 4:
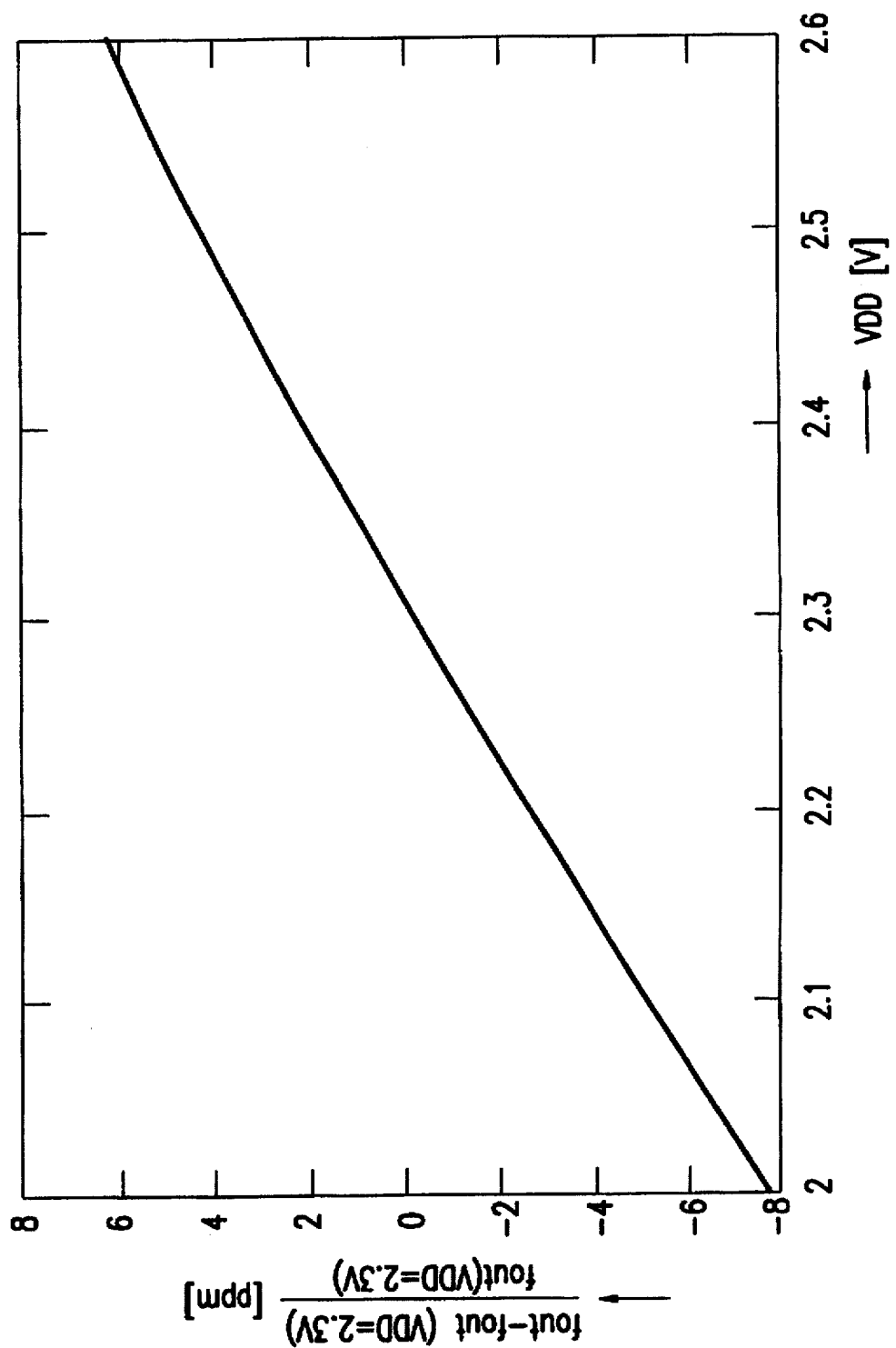
FIG. 4 is the diagram showing the example of the frequency-power supply voltage characteristics of the oscillator circuit.

With the power supply voltage VDD(T) changing in the oscillator circuit 8, the voltage-dependent reactance component such as capacitance between terminals within the CMOS inverter 33 changes, and the reactance characteristic of the entire oscillator circuit 8 accordingly changes. As a result, the oscillator circuit 8 is provided with the frequency-temperature characteristic as shown in FIG. 4, wherein the frequency deviation $\Delta f/fO$ of the output fout is rightward upwardly inclined with the power supply voltage VDD(T), namely proportional to the power supply voltage VDD(T). By taking advantage of the frequency characteristic of the oscillator circuit 8, the temperature-compensated piezoelectric oscillator 1 performs temperature compensation, namely, the temperature-compensated piezoelectric oscillator 1 raises the power supply voltage fed to the oscillator circuit 8 in proportion to the ambient temperature T to offset the rightward downwardly inclined variation of the frequency deviation $\Delta f/fO$ of the piezoelectric oscillator element 9.

The variable power supply circuit 15, as shown in FIG. 1, comprises a voltage regulator circuit 3, a data memory circuit (data memory means) 4, a function generator circuit 5, a temperature function supply voltage generator circuit 6, and the fO adjustment circuit 7. The voltage regulator circuit 3 is the circuit for generating the reference voltage Vreg of the function generator circuit 5, and makes a supply source that is influenced less by voltage variations of the power supply voltage of the temperature-compensated piezoelectric oscillator 1.

Figure 5:
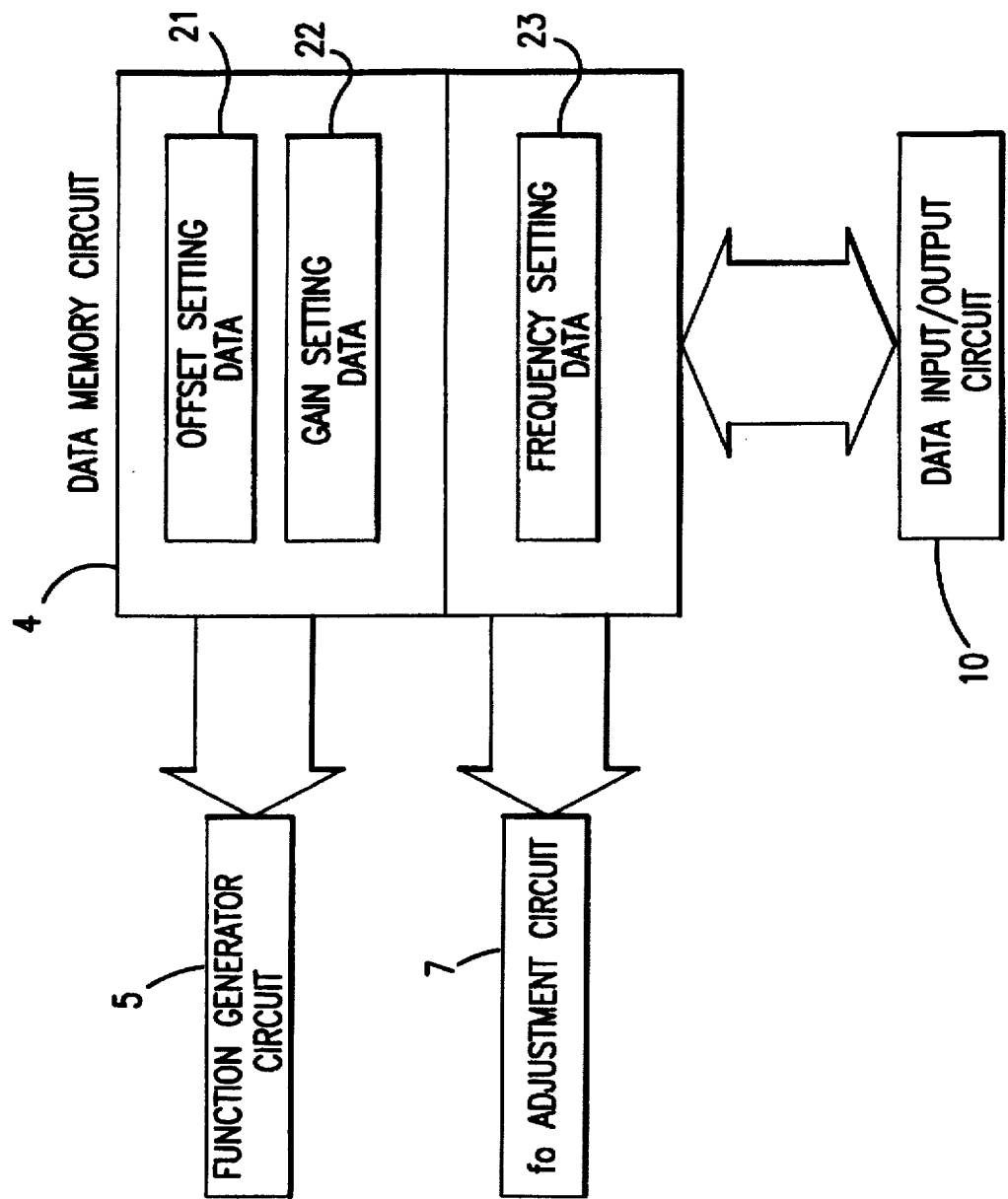
FIG. 5 is the block diagram showing the example of the setting data of the data memory circuit.

The data memory circuit 4 is constructed of a non-volatile semiconductor memory such as an EEPROM, and after assembly of the temperature-compensated piezoelectric oscillator 1, the fO temperature characteristic adjustment circuit 11 external to the temperature-compensated piezoelectric oscillator 1 is connected to the data memory circuit 4 via a data input/output circuit 10 as shown in FIG. 1. In this condition, written and stored onto the data memory circuit 4 are the temperature characteristic compensating data comprising offset setting data (additional constant) 21 for modifying the frequency-temperature characteristics of the piezoelectric oscillator element 9 and gain setting data (multiplication coefficient) 22, and frequency setting data 23 for adjusting the reference frequency fO, as shown in FIG. 5.

The gain setting data 22 is the data that determines the slope of the control voltage Vcont(T), to be described later, with respect to the change of the ambient temperature T (refer to FIG. 10), and is made up of bit data representing any of three bits $(000)_2$-$(111)_2$, for example. The offset setting data 21 is the data for compensating the shift of voltage at the reference temperature that takes place when the gain, namely the slope of the control voltage Vcont(T) changes, and for example, is made up of bit data of 5 bit resolution representing the shift. The frequency setting data 23 is the data for compensating for the shift of the oscillation frequency of the oscillator circuit 8 at the reference temperature with respect to the reference frequency fO to be set, and is made up of n bits, for example, n=8 bits, where n is equal to the number of switch elements 32, 1~n.

These setting data 21, 22, and 23 are set to match the frequency-temperature characteristics of each piezoelectric oscillator element 9 used in the temperature-compensated piezoelectric oscillator 1 so that these setting data compensate for differentials due to variations from element to element by means of the fO temperature characteristic adjustment circuit 11, and then stored in the data memory circuit 4. After these setting data 21, 22 and 23 are set, namely after adjustment procedure in succession to assembly is completed, the fO temperature characteristic adjustment circuit 11 is electrically disconnected from the temperature-compensated piezoelectric oscillator 1.

The fO adjustment circuit 7, as shown in FIG. 2, is connected to the junction G of the oscillator circuit 8, and to compensate for manufacturing variations of the reference frequency fO of the piezoelectric oscillator element 9, the fO adjustment circuit 7 changes the load capacitance of the capacitor Cg at the gate side of the CMOS inverter 33 to change the reactance characteristic of the oscillator circuit 8, thereby adjusting the reference frequency fO of the oscillator circuit 8. As shown, the fO adjustment circuit 7 is constructed of a plurality, n, of capacitors (for example, n=8), 31-1~31-n (31-8) and a plurality of switches 32-1~32-n (32-8) which are connected in series with respective capacitors, and the ON/OFF states of the switches 32-1~n are controlled by the frequency setting data 23 in the data memory circuit 4. Specifically, the reference frequency fO of the oscillator circuit 8 is adjusted by changing the capacitance between the gate of the oscillator circuit 8 and ground (between A and B in the figure) in accordance with the value of the frequency setting data 23.

The temperature sensor circuit 2 comprises a temperature sensor that makes use of the forward voltage characteristic of a semiconductor P-N junction, and is designed to pick up the ambient temperature T and to output the sensed temperature as a temperature-dependent voltage Vsens(T). The temperature-dependent voltage Vsens(T) provides a linearly changing characteristic with respect to the ambient temperature T as shown in FIG. 9.

Figure 6:
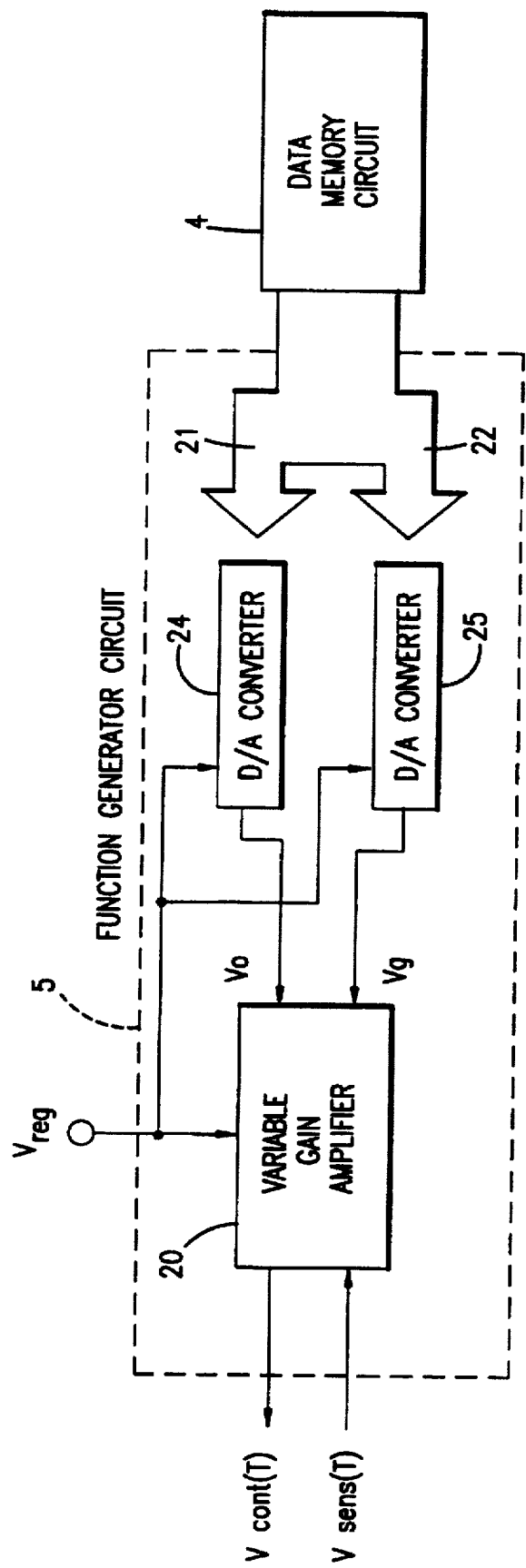
FIG. 6 is the block diagram showing the example of the construction of the function generator circuit.

The function generator circuit 5, as shown in FIG. 6, comprises two D/A converters 24 and 25, and a variable gain amplifier 20, and, based on the reference voltage Vreg from the voltage regulator 3, the temperature-dependent voltage Vsens(T) from the temperature sensor circuit 2, and the offset setting data 21 and gain setting data 22 from the data memory circuit 4 in FIG. 4, the function generator circuit 5 generates the control voltage Vcont(T) and outputs it to the temperature function supply voltage generator circuit 6.

Figure 7:
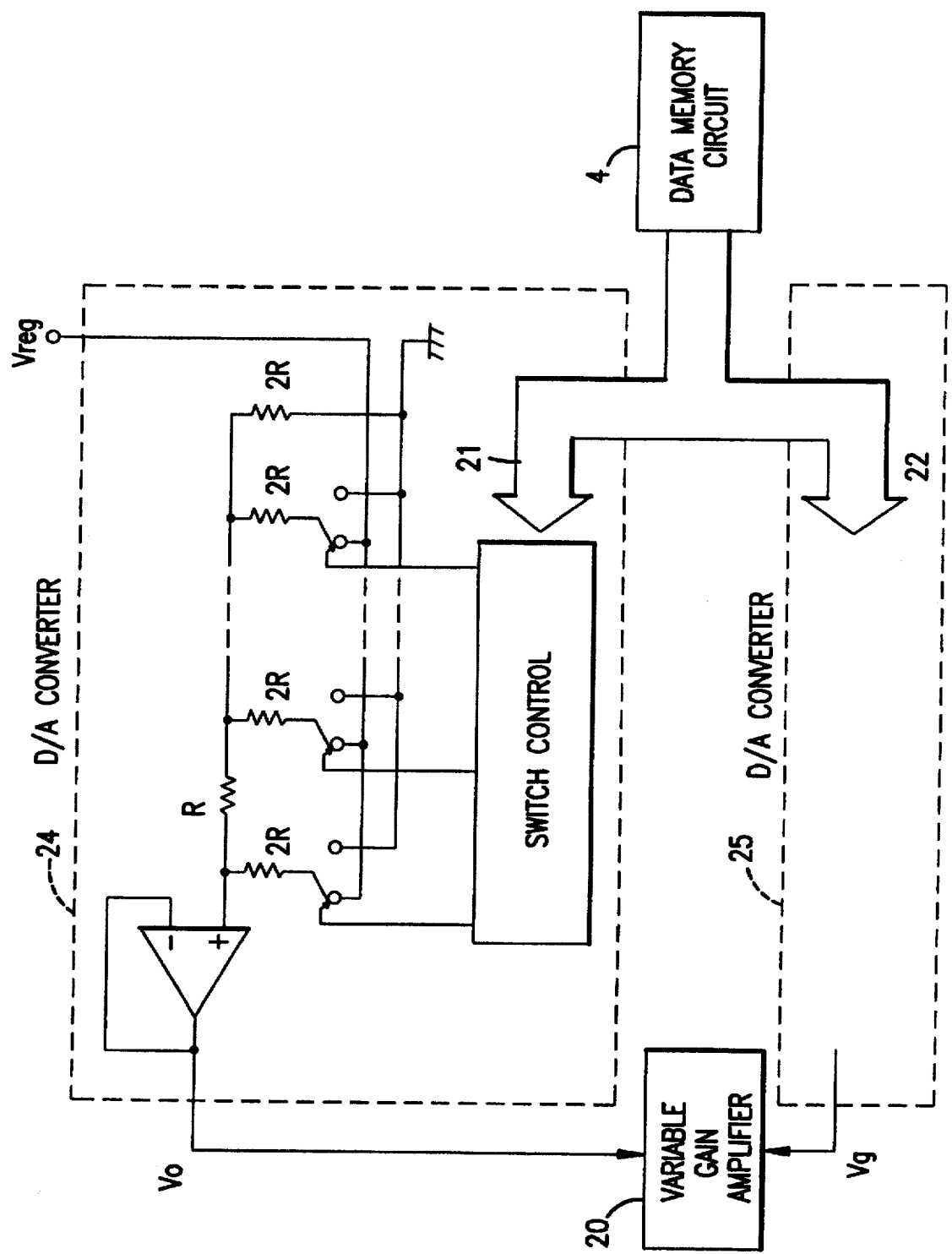
FIG. 7 is the diagram showing the example of the construction of the D/A converter.
Figure 8A:
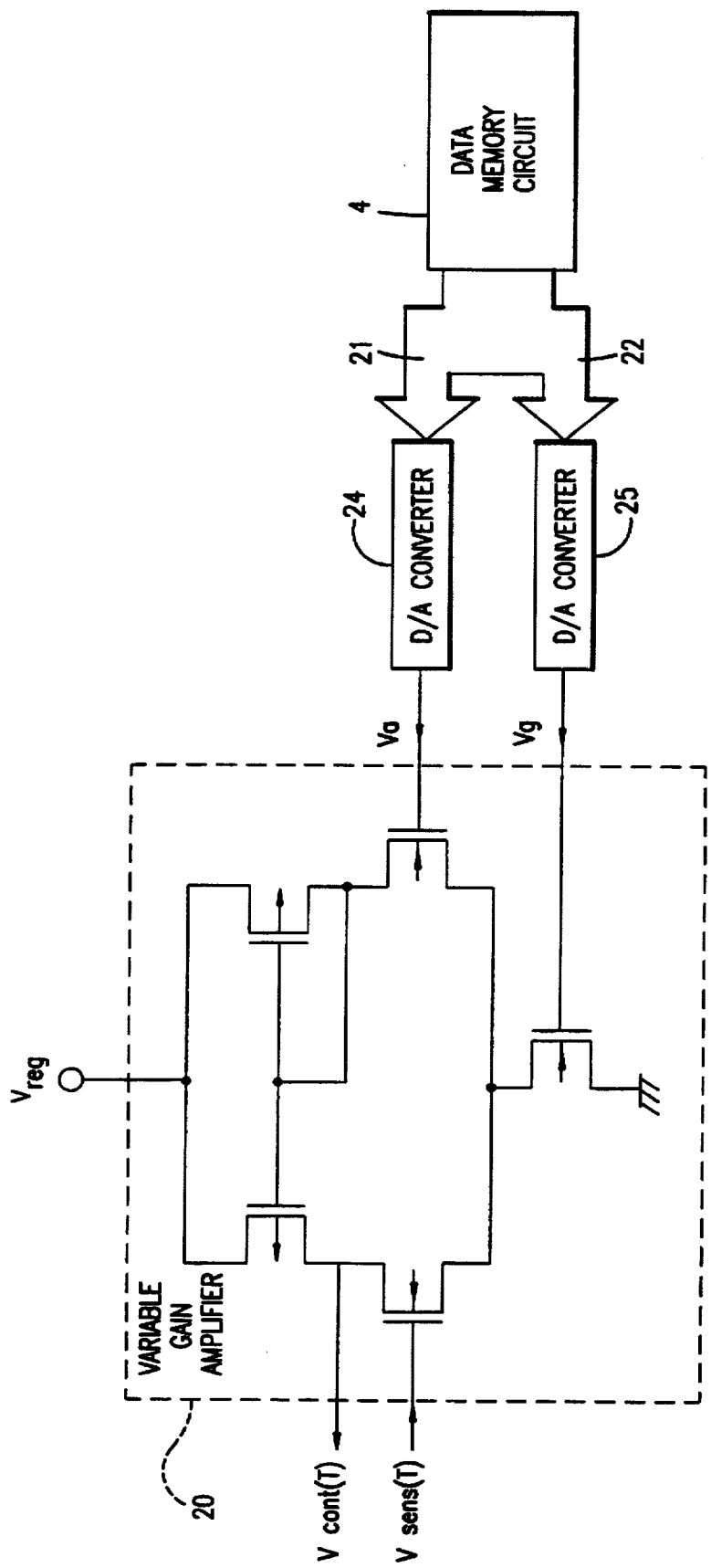

The D/A converters 24 and 25, as shown in FIG. 7, are constructed of an R-2R ladder-resistor-type D/A converter, and convert the offset setting data 21 and the gain setting data 22 in the data memory circuit 4 into an analog offset setting voltage Vo and an analog gain setting voltage Vg, respectively, and outputs them to the variable gain amplifier 20. The variable gain amplifier 20, as shown in FIG. 8(a), is the differential amplifier driven by the reference voltage Vreg from the voltage regulator circuit 3, and the variable gain amplifier 20 modifies according to the gain setting voltage Vg the gain which is the slope of the temperature-dependent voltage Vsens(T) from the temperature sensor circuit 2, while setting the voltage at the reference temperature to a predetermined voltage by compensating for the voltage based on the differential between the temperature-dependent voltage Vsens(T) and the offset setting voltage Vo, and then outputting the resulting voltage as the control voltage Vcont(T) to the temperature function supply voltage generator circuit 6.

Figure 9:
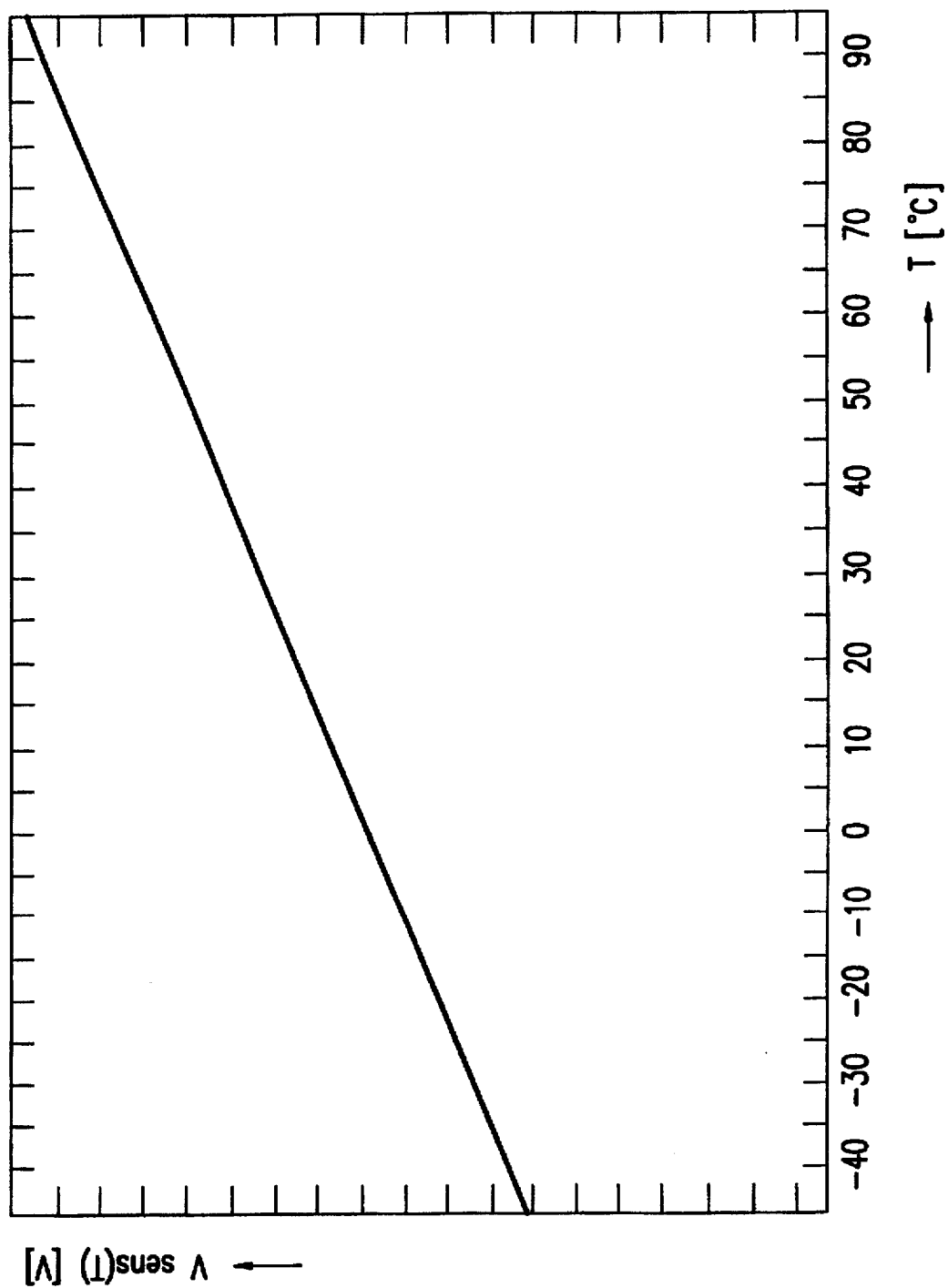
FIG. 9 is the diagram showing the example of the output voltage-temperature characteristics of the temperature sensor circuit.
Figure 10:
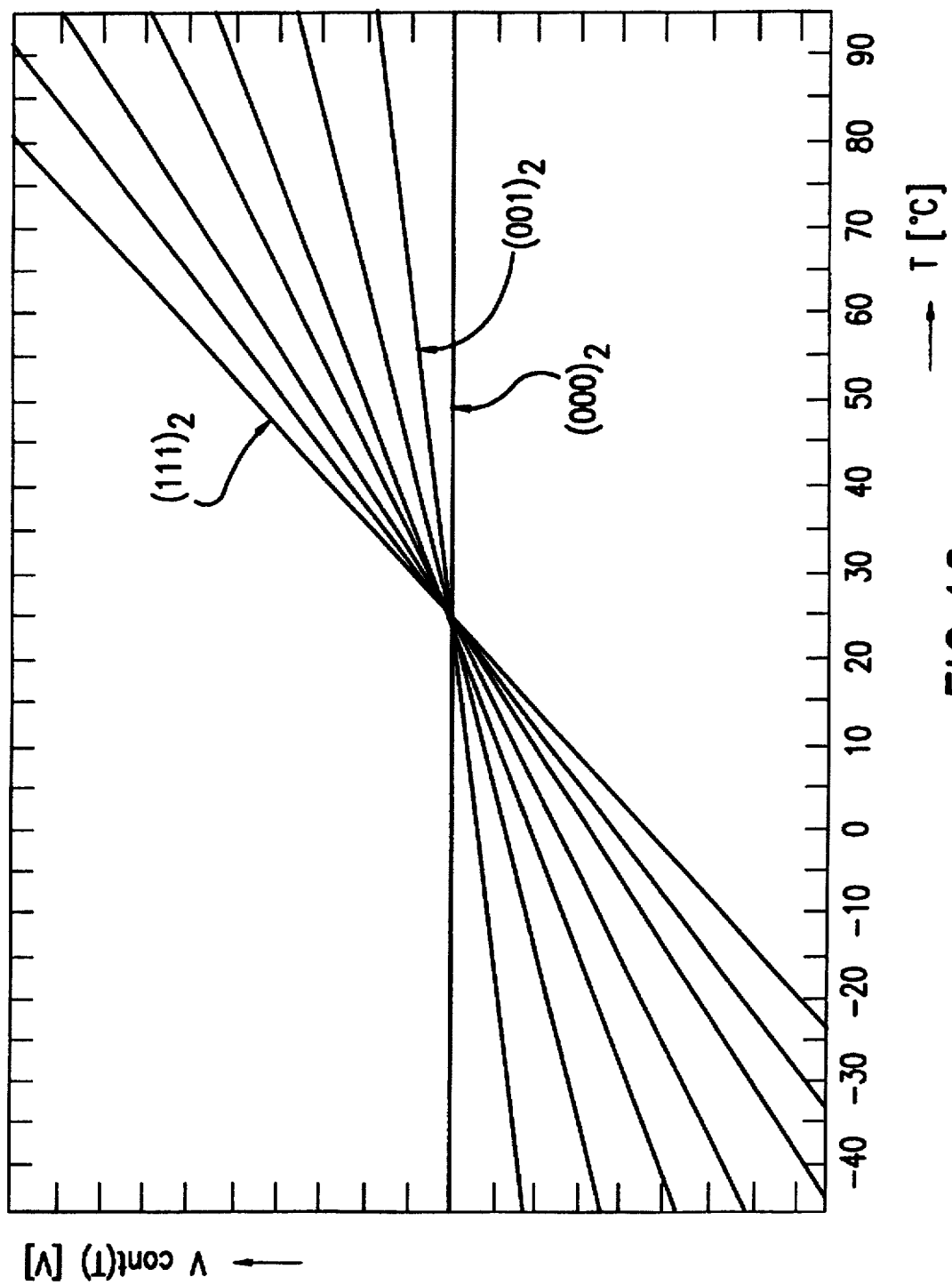
FIG. 10 is the diagram showing the example of the output voltage-temperature characteristics of the function generator circuit.

Since the temperature-dependent voltage Vsens(T), as already described, is provided with the linear characteristic as in FIG. 9, the function generator circuit 5, as shown in FIG. 10, is allowed to select, as the temperature characteristic of the control voltage Vcont(T), one from a plurality of temperature characteristics which have different linear characteristics with different gains (slopes) but the same voltage at the reference temperature, according to the 3-bit gain setting data 22 from the data memory circuit 4. Specifically, as shown, when the gain setting data 22 has a value $(000)_2$, the rate of change of temperature of the control voltage Vcont(T) with respect to temperature is small, and as the gain setting data 22 increases from $(001)_2, \ldots, (111)_2$, the rate of increase of temperature of the control voltage Vcont (T) increases, and thus, by modifying the gain setting data 22 and the offset setting data 21 stored in the data memory circuit 4, the output voltage Vcont(T) is changed in a stepwise fashion.

Figure 11:
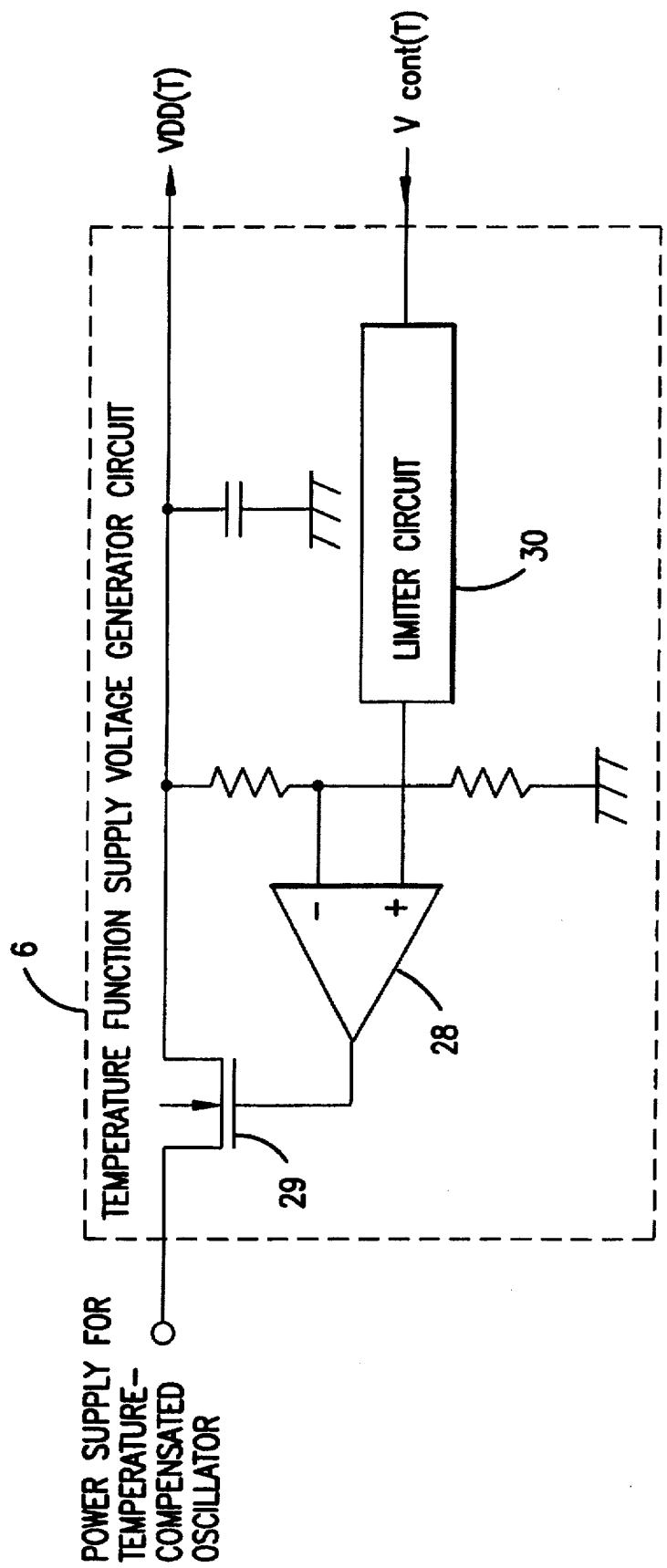
FIG. 11 is the diagram showing the example of the construction of the temperature function supply voltage generator circuit.

The temperature function supply voltage generator circuit 6, comprising a differential amplifier 28, a control transistor 29, and a limiter circuit 30 as shown in FIG. 11, generates, within a predetermined voltage range of change, the power supply voltage VDD(T) proportional to the control voltage Vcont(T) by the differential amplifier 28 and the control transistor 29, while preventing the power supply voltage VDD(T) from going in excess of the predetermined range of change by the limiter circuit 30. By limiting the range of change of the power supply voltage VDD(T), the limiter circuit 30 prevents the frequency-power supply characteristic of the oscillator circuit 8 from deteriorating when the power supply voltage VDD(T) rises up to the vicinity of the power supply voltage of the temperature-compensated piezoelectric oscillator 1, while preventing the suspension of the oscillation of the oscillator circuit 8 that takes place when the power supply voltage VDD(T) falls down to the oscillation cutoff voltage.

Figure 12:
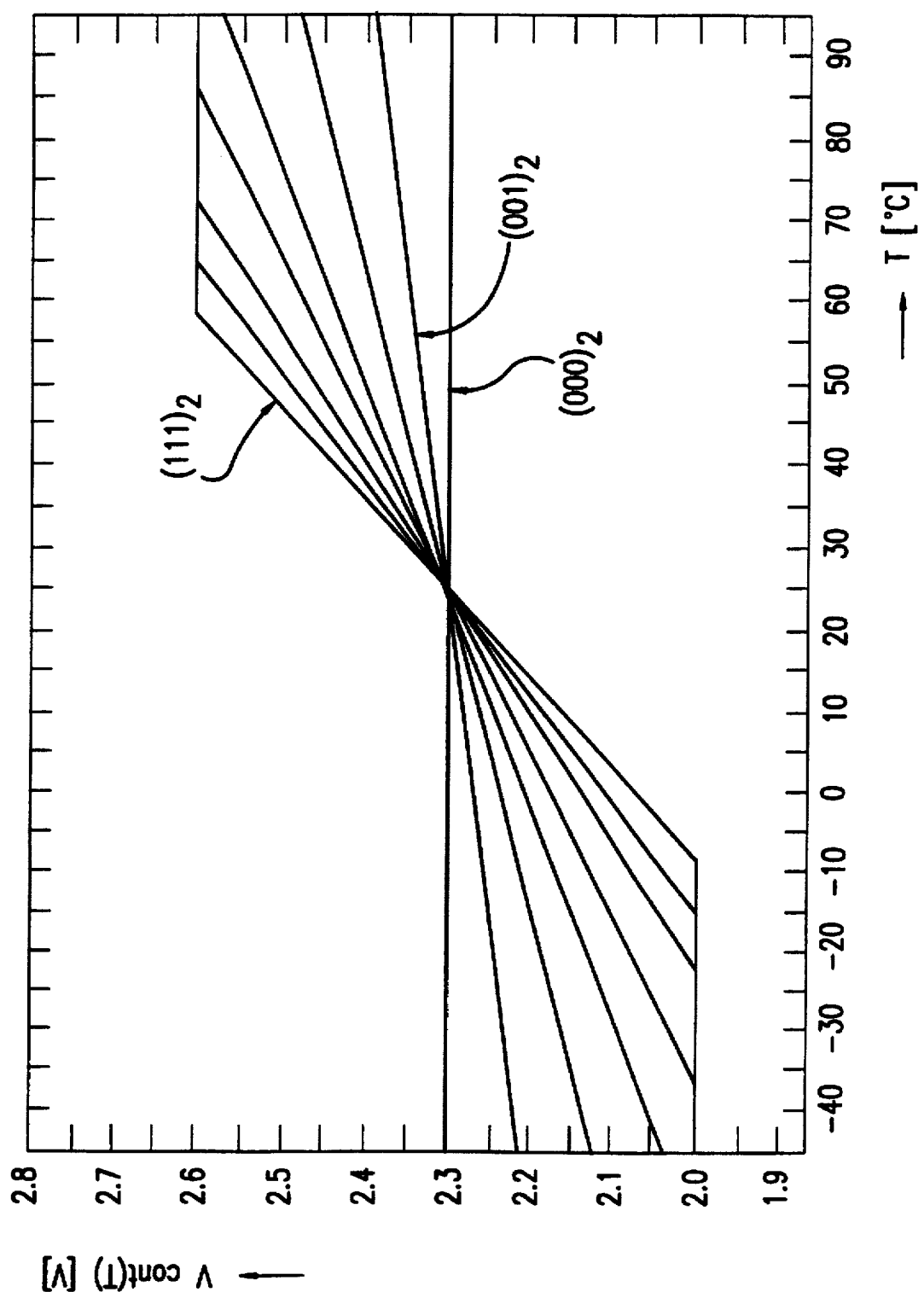
FIG. 12 is the diagram showing the example of the output voltage-temperature characteristics of the temperature function supply voltage generator circuit.

Compared to the temperature characteristics of the control voltage Vcont(T) in FIG. 10, the power supply voltage VDD(T) has temperature characteristics that get clipped at an upper and lower voltages as shown in FIG. 12. Generally, the oscillator circuit 8 tends to have a narrower oscillation margin and a raised oscillation cutoff voltage at a higher temperature, the power supply voltage VDD(T) varies in proportion to the control voltage Vcont(T) within the predetermined range of change, and the power supply voltage VDD(T) is set to be higher at a high temperature than at a lower temperature, thereby assuring the oscillation margin of the oscillator circuit 8 at a high temperature.

Figure 13:
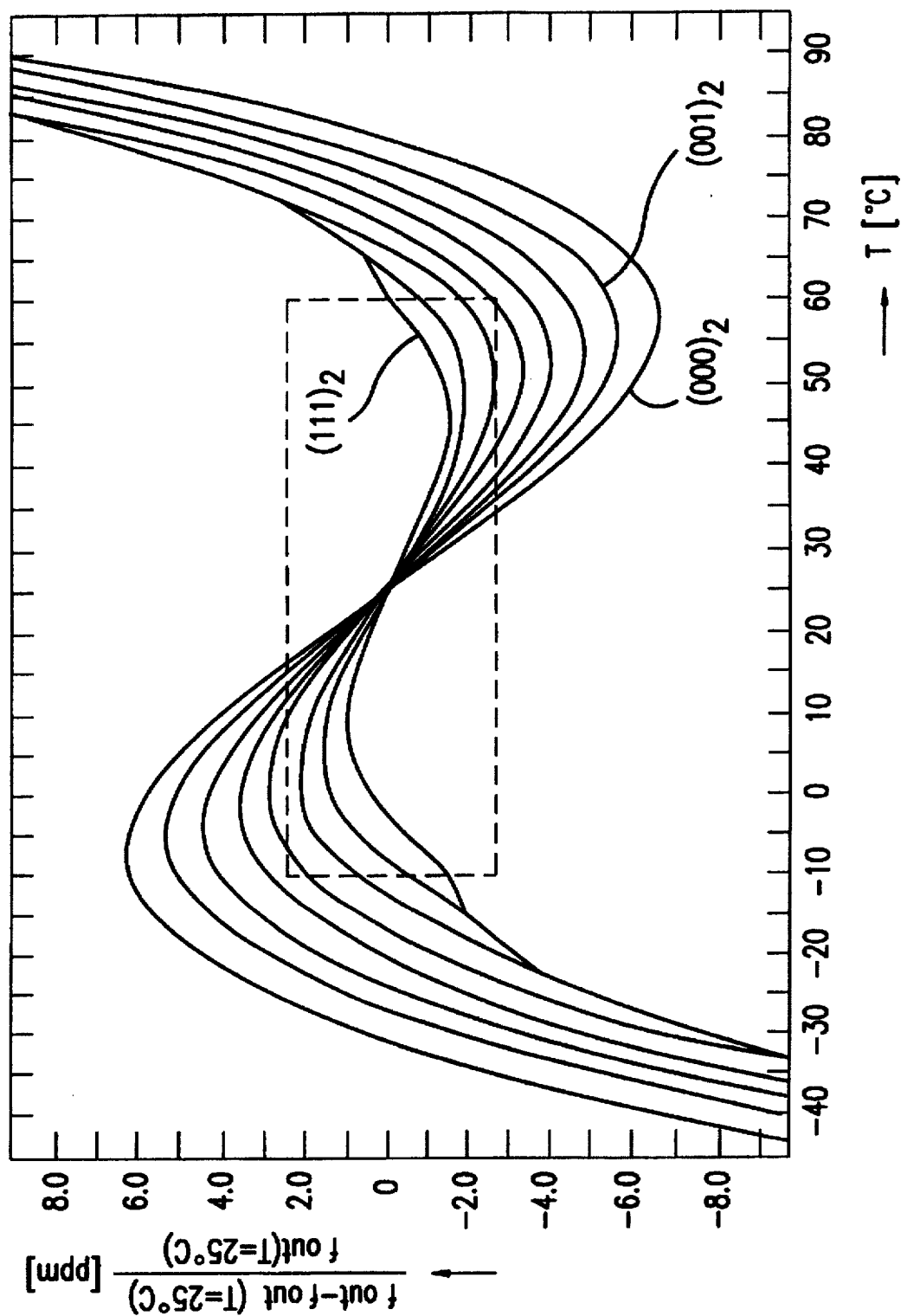
FIG. 13 is the diagram showing the example of the frequency-temperature characteristics of the temperature-compensated piezoelectric oscillator in response to the modified setting of the gain setting data.

As already described, during adjustment of the temperature-compensated piezoelectric oscillator 1 after its assembly, the offset setting data 21, the gain setting data 22, and the frequency setting data 23 are set to the data memory circuit 4 in FIG. 5 by connecting the fO temperature characteristic adjustment circuit 11. In this case, when the gain setting data 22 is modified on the same piezoelectric oscillator element 9, the frequency-temperature characteristics of the output fout of the temperature-compensated piezoelectric oscillator 1 is varied in response to the modified gain setting data 22 as shown in FIG. 13, depending on the combination of the temperature characteristic of the power supply voltage VDD(T) in FIG. 12 and the frequency characteristic of the oscillator circuit 8 already described with reference to FIG. 4. Namely, by modifying the setting of the gain setting data 22, the frequency-temperature characteristic of the temperature-compensated piezoelectric oscillator 1 is changed.

Figure 14:
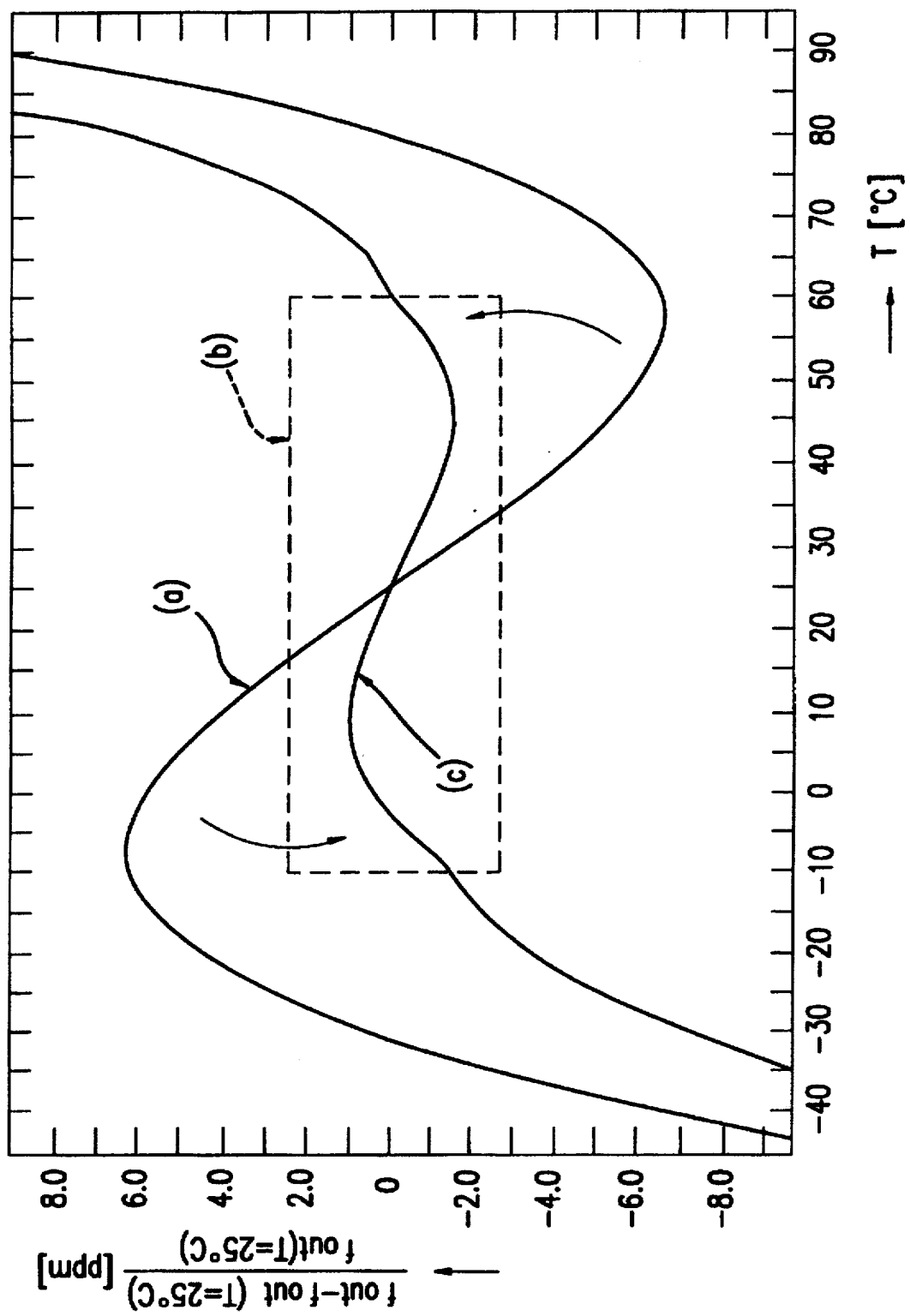
FIG. 14 is the diagram showing the example of the frequency-temperature characteristics of the temperature-compensated piezoelectric oscillator after temperature compensation is carried out.

Therefore, it is possible to compensate for variations of the frequency-temperature characteristics due to variations among individual piezoelectric oscillator elements 9 by properly setting the gain setting data 22 and to provide a sufficient temperature compensation. For example, when the piezoelectric oscillator element 9 has the frequency-temperature characteristic shown in a curve (a) in FIG. 14 (identical to FIG. 3), the power supply voltage VDD(T) having the temperature characteristic of $(111)_2$ in FIG. 12 is fed to the oscillator circuit 8 in response to the ambient temperature T by setting a gain setting data 22 of $(111)_2$. In this way, the oscillator circuit 8 having the power supply VDD-frequency characteristics in FIG. 4 changes its oscillation frequency in a manner that offsets the frequency-temperature characteristics of the piezoelectric oscillator element 9 represented by the curve (a) in FIG. 14. As a result, the overall temperature-compensated piezoelectric oscillator 1 provides the frequency-temperature characteristic represented by a curve (c) in the same figure, which is within the target range designated (b), namely the frequency-temperature characteristic of ±2.5 [ppm] within a temperature range of −10–+60 [° C.]. Another piezoelectric oscillator element having a frequency-temperature characteristic different from that of the above piezoelectric oscillator element 9 is temperature-compensated for just the same way without any problem.

Figure 15:
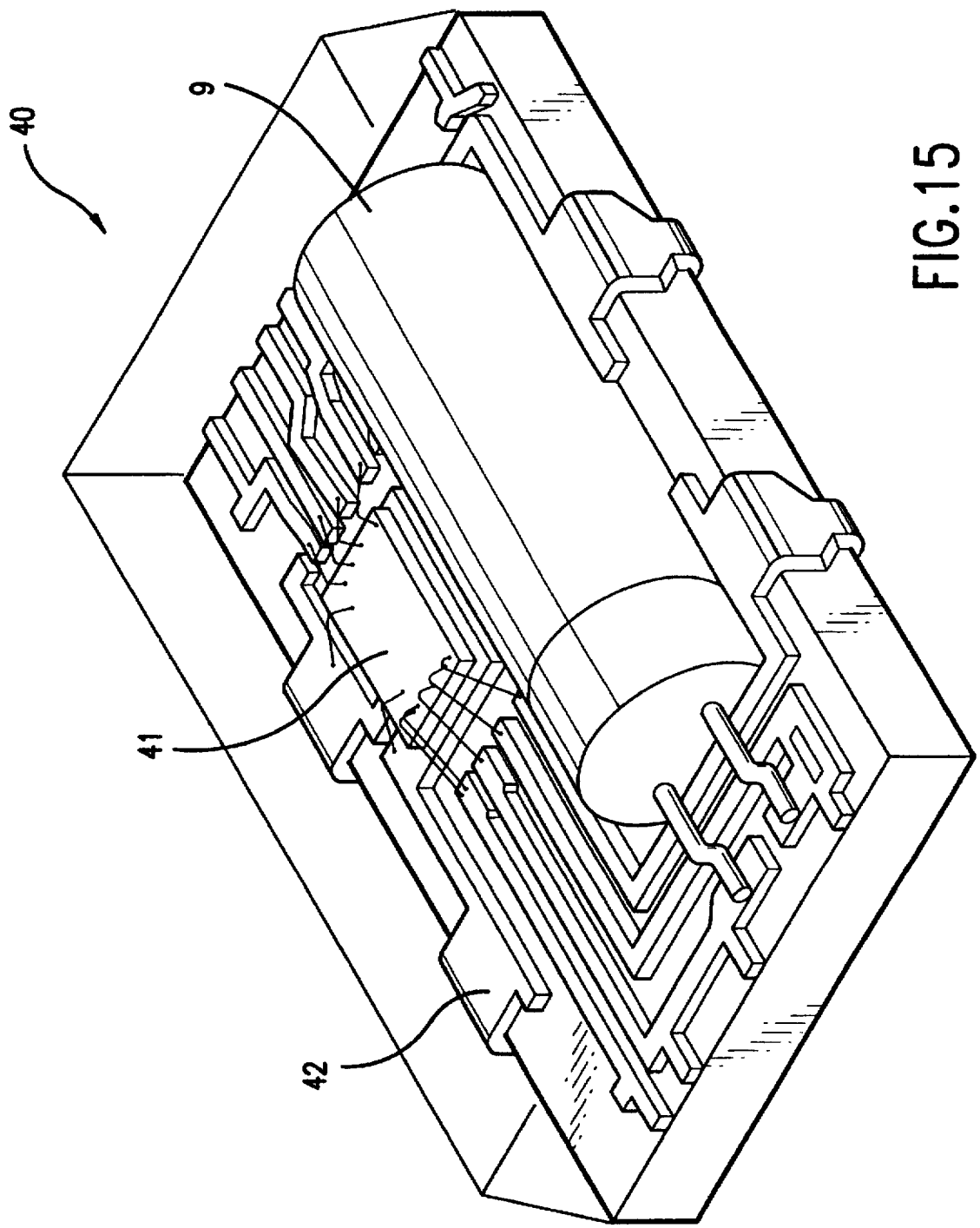
FIG. 15 is the perspective view showing the example of the construction of the temperature-compensated piezoelectric oscillator.

Since the above-described components in the temperature-compensated piezoelectric oscillator 1, except the piezoelectric oscillator element 9, are constructed of an element easy to integrate into an IC structure, all of these component may be integrated into a temperature-compensated piezoelectric oscillator IC 41. Furthermore, the temperature-integrated piezoelectric oscillator IC 41 together with the piezoelectric oscillator element 9 is mounted on a lead frame 42 as shown in FIG. 15 and then packaged integrally into a plastic mold 40. In these arrangements, the entire temperature-compensated piezoelectric oscillator 1 is further miniaturized, thus easy to mass produce, and easy to handle. Reliability is enhanced as a result of IC structure, and mass production helps reduce the manufacturing cost.

As described above, when the oscillation frequency of the piezoelectric oscillator element 9 varies in response to the ambient temperature in the temperature-compensated piezoelectric oscillator 1, the power supply voltage VDD(T) is changed in response to the ambient temperature T and the oscillation frequency is then changed in response to the power supply voltage VDD(T), and thereby the oscillation frequency of the entire temperature-compensated piezoelectric oscillator 1 is kept to the predetermined range by offsetting the frequency-temperature characteristics of the piezoelectric oscillator element 9. Since the frequency-temperature characteristics are compensated for by changing the power supply voltage VDD(T), the installation of an external variable reactance element to the oscillator circuit 8, as would be required in the prior art, is not necessary. Therefore, each circuit element in the temperature-compensated piezoelectric oscillator 1 is easy to manufacture in CMOS process, and thus integrating them into an IC structure is easy.

Figure 24:
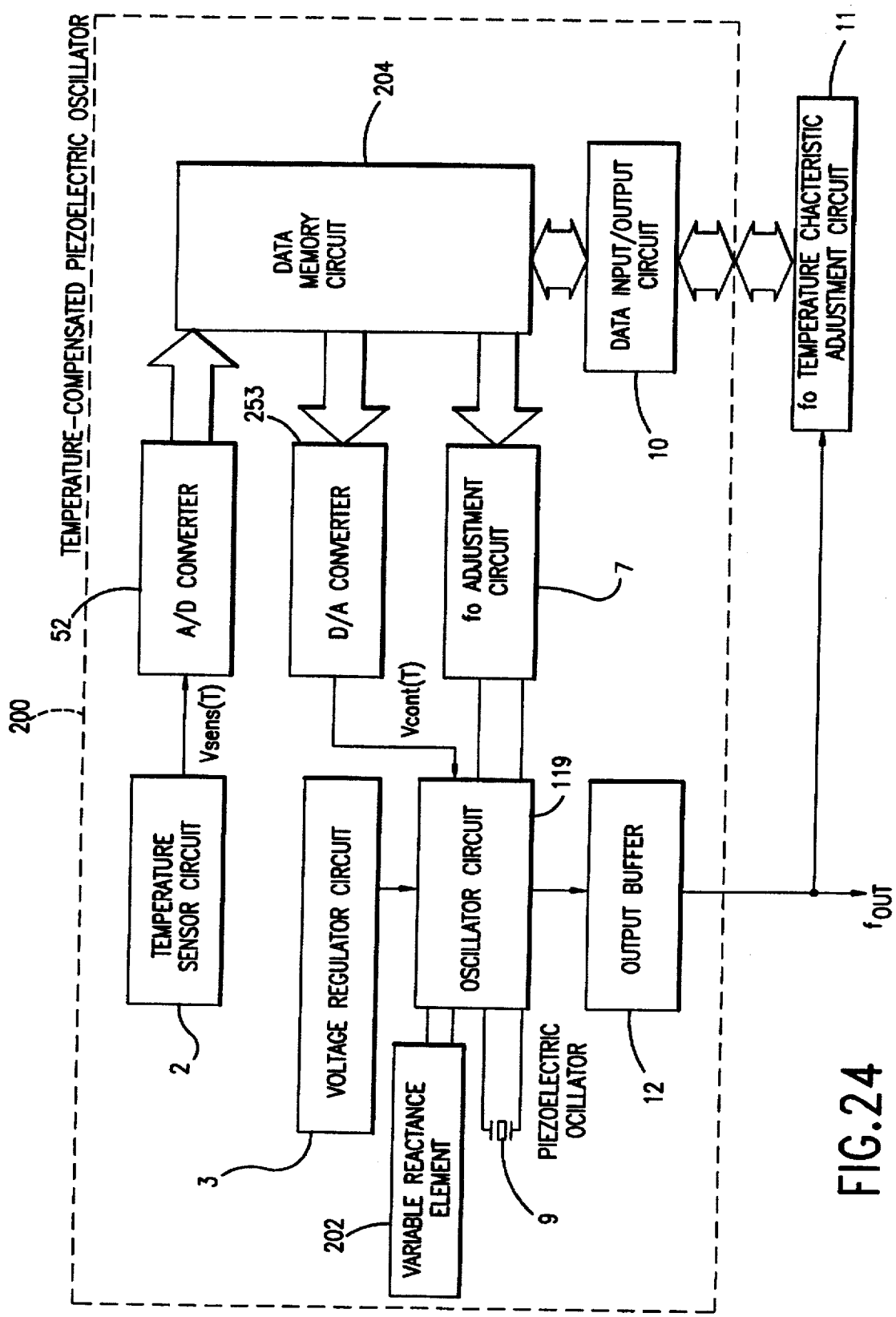
FIG. 24 is the block diagram showing the example of a digital temperature-compensated piezoelectric oscillator.
Figure 25:
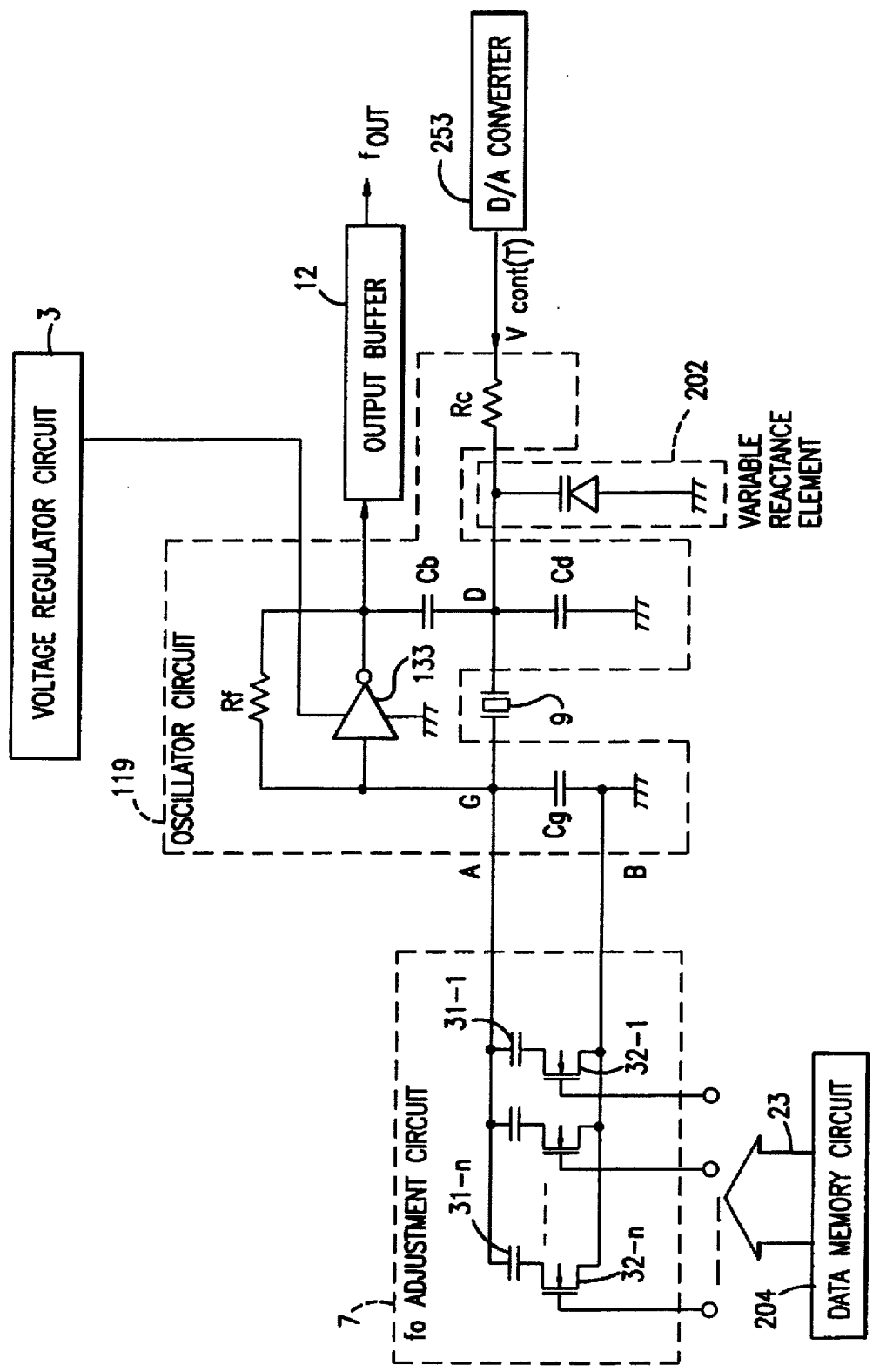
FIG. 25 is the diagram showing the connection of the oscillator circuit of the temperature-compensated piezoelectric oscillator of FIG. 24 with its peripheral circuits and the construction of the oscillator circuit.
Figure 26:
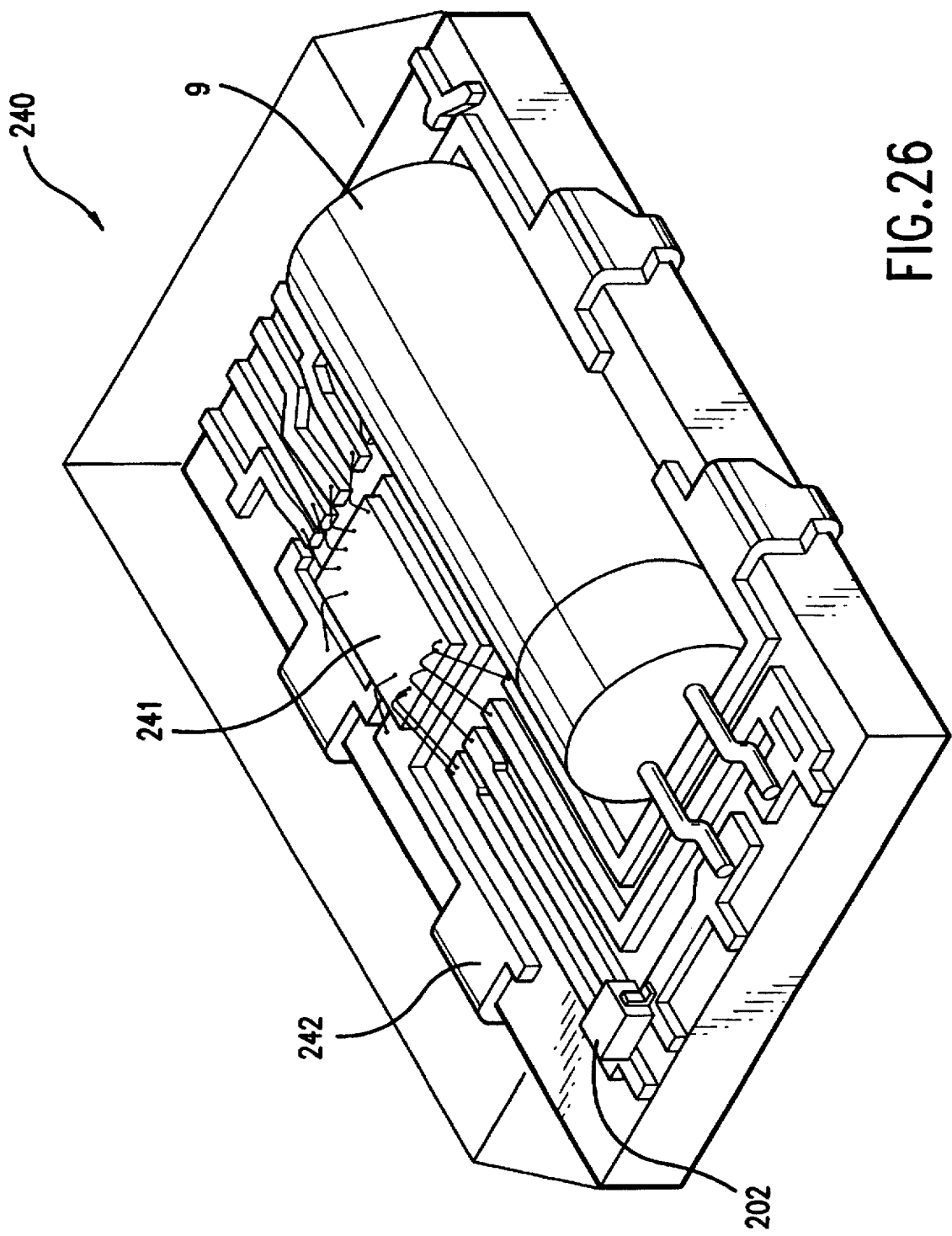
FIG. 26 is the perspective view showing the example of the construction of the temperature-compensated piezoelectric oscillator of FIG. 24.

The temperature-compensated piezoelectric oscillator 1 will work if it has, as data to be stored in the data memory circuit 4, a single set of data that matches the characteristic of the piezoelectric oscillator element 9 in use, wherein the set of data is made up of the gain setting data (multiplication coefficient) 22 and offset setting data (additional constant), both as the temperature characteristic compensating data, and the frequency setting data 23, and, for example, the set of data of 3 bits, 5 bits, and 8 bits, respectively, 16 bits in total, is sufficient and substantially smaller than in the prior art digital temperature-compensated piezoelectric oscillator 200 in FIG. 24, and for this reason, miniaturization and cost reduction of the IC chip of the temperature-compensated piezoelectric oscillator IC 41 are promoted.

Since setting data such as the temperature characteristic compensating data is entered to the temperature-compensated piezoelectric oscillator 1 from the outside after it is manufactured, variations in circuit characteristics due to manufacturing variations are individually adjusted without replacement of internal circuit elements. Because of this feature, the temperature-compensating piezoelectric oscillator IC 14 may be mass produced, reduced in cost and easy to adjust after manufacturing.

In the temperature-compensating piezoelectric oscillator 1, the limiter circuit 30 limits the power supply voltage of the oscillator circuit 8 to the predetermined range of change. In this case, by limiting the power supply voltage of the oscillator circuit 8 to the predetermined voltage that is lower than the power supply voltage of the temperature-compensating piezoelectric oscillator 1, the temperature-compensating piezoelectric oscillator 1 becomes reliable and insensitive to variations of the power supply voltage of the temperature-compensating piezoelectric oscillator 1, and by limiting the power supply voltage of the oscillator circuit 8 to the predetermined voltage that is higher than the oscillation cutoff voltage, a temperature-compensating piezoelectric oscillator 1 becomes stable and free from oscillation interruption.

Although the construction of the D/A converter 25 shown in FIG. 7 and FIG. 8(a) is of an R-2R ladder-resistor-type. Current sources 26-I1~In are available as a gain adjusting method instead of the D/A converter 25. The current sources 26-I1~In shown enclosed by the dotted line in FIG. 8(b) may be switched ON/OFF for digitally controlling the current.

Figure 16A:
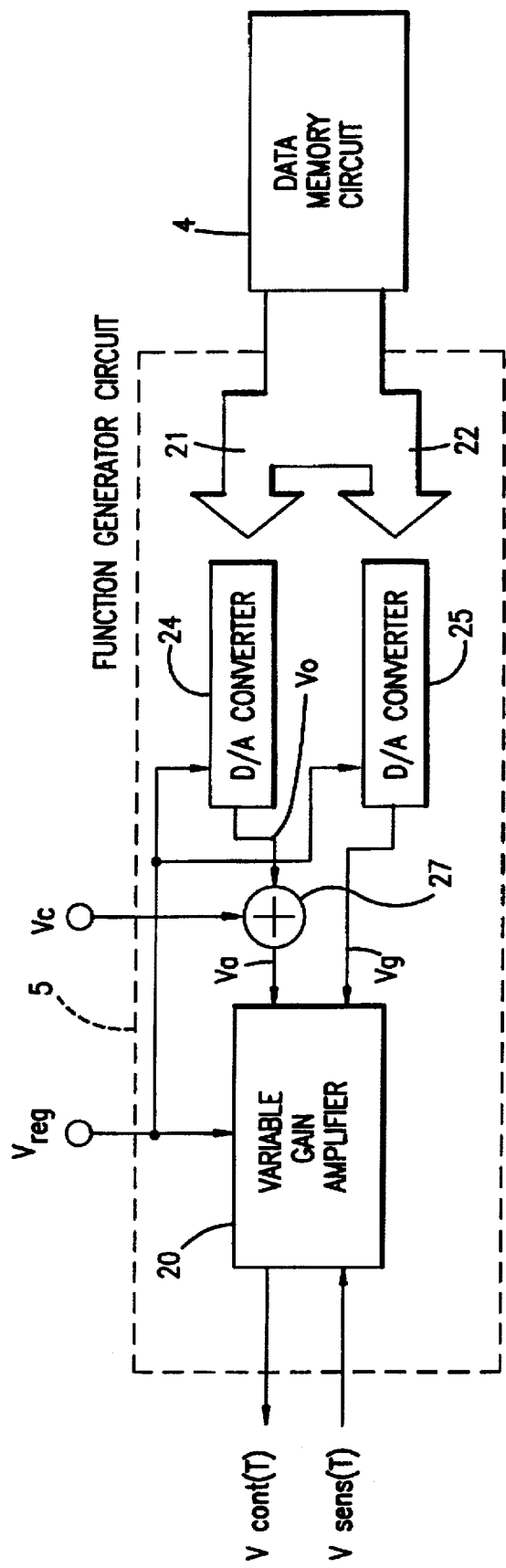
FIGS. 16(a) and 16(b) are the block diagram showing another example of the construction of the function generator circuit.
Figure 16B:
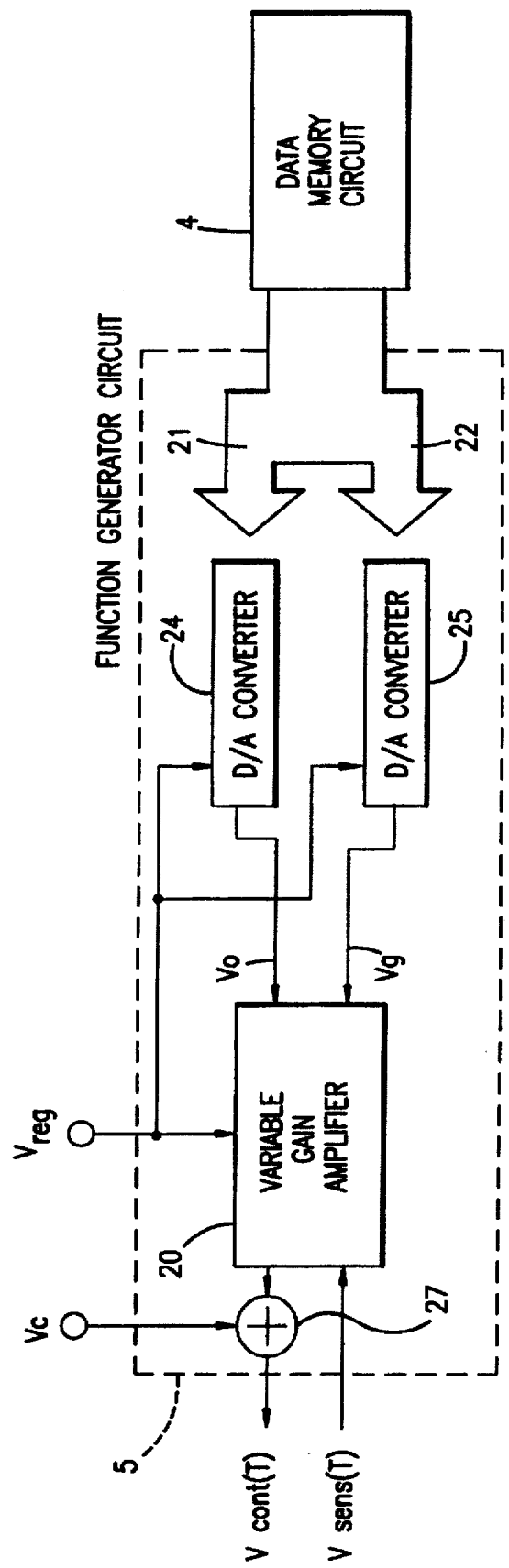
Figure 17:
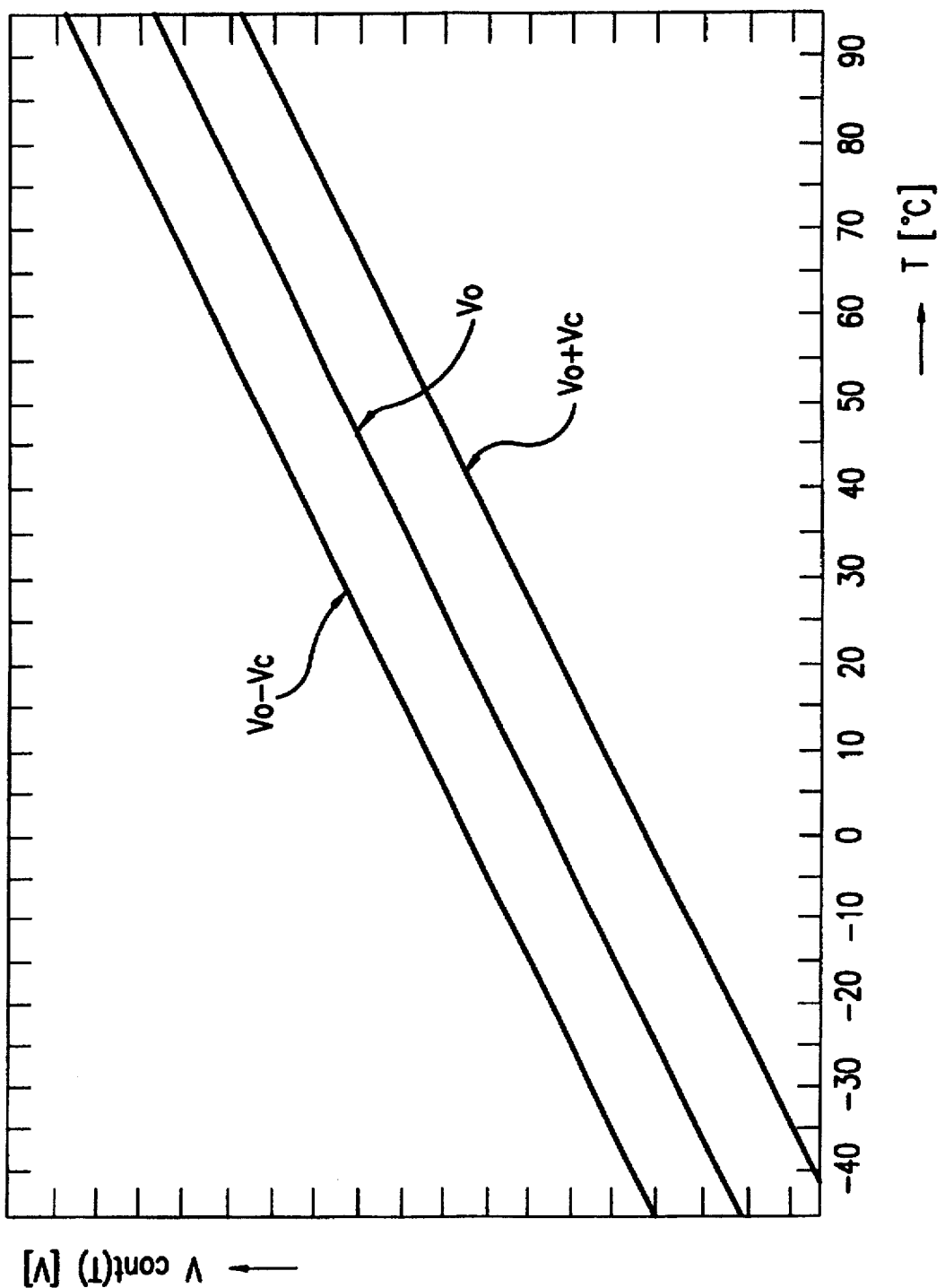
FIG. 17 is the diagram showing the example of the output voltage-temperature characteristics of the function generator circuit of FIG. 16.

Instead of the construction shown in FIG. 6, the function generator 5 may be constructed of a circuit that performs frequency control by a control voltage Vc from outside the temperature-compensated piezoelectric oscillator 1, for example, may be constructed of an adder 27. In this case, the adder 27 designated (a) in the same figure changes the control voltage Vcont(T) as shown in FIG. 17 by adding and subtracting the control voltage Vc from the outside to or from the offset setting voltage Vo for the variable gain amplifier 20, and in this way the frequency-temperature characteristic of the oscillating circuit 8 is entirely shifted upward or downward in level. Since in this arrangement the reference frequency f0 of the oscillator circuit 8 is adjusted through the external control voltage Vc, the f0 adjustment circuit 7 in FIG. 1 and FIG. 2 is dispensed with. The adder 27, if connected to the output side of the variable gain amplifier 20 as shown in FIG. 16(b), provides the same effect as above.

In the temperature-compensated piezoelectric oscillator 1 of this embodiment, the variable power supply 15 is designed to compensate for the frequency deviation Δf/fO using the linear coefficient A of the piezoelectric oscillator element 9, and furthermore, a precision compensation within a wider range of the ambient temperature T may be performed including the compensation for the frequency deviation Δf/fO in terms of the quadratic coefficient B and the cubic coefficient C of the piezoelectric oscillator element 9.

Figure 18:
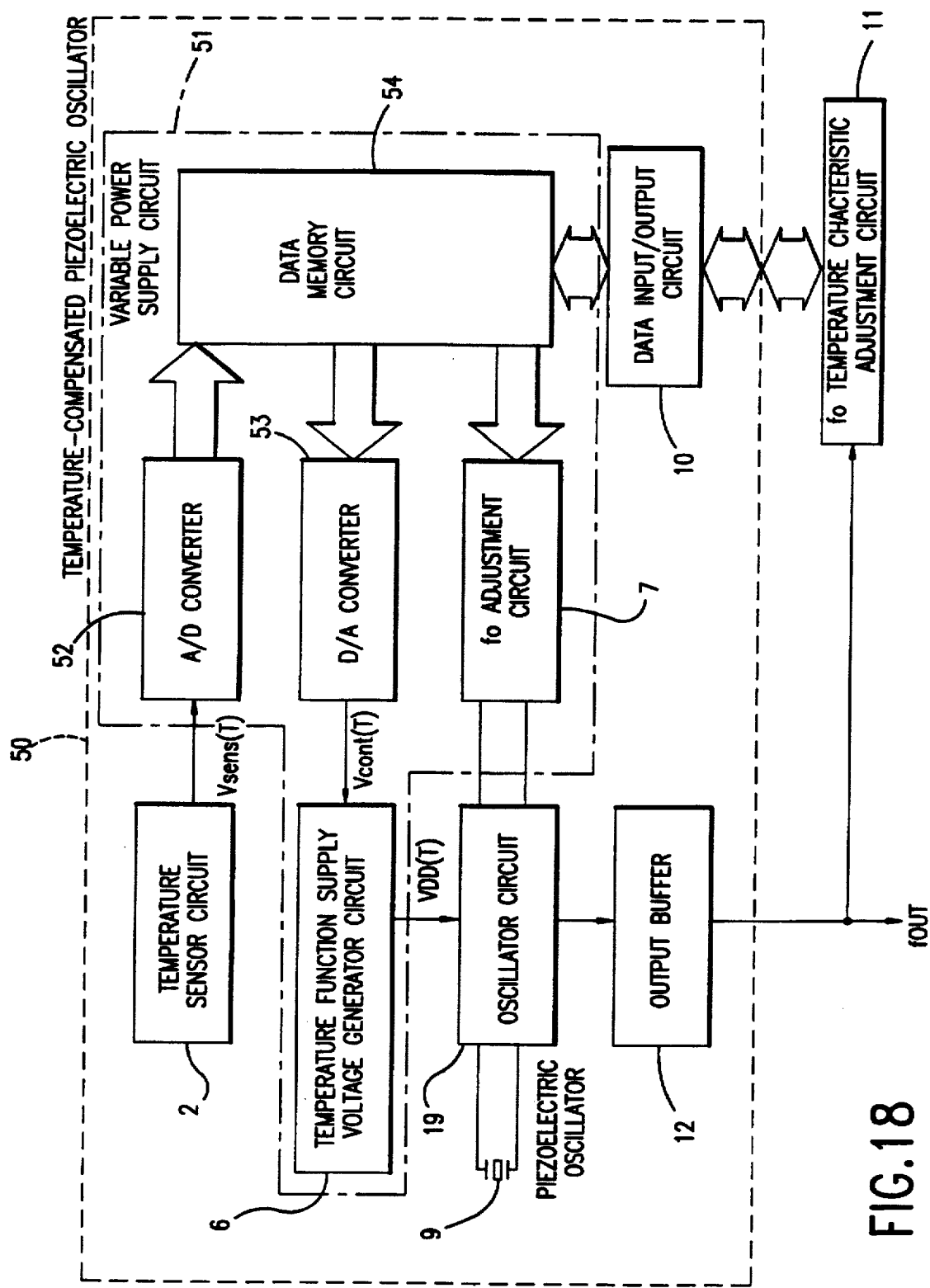
FIG. 18 is the diagram showing another embodiment of the present invention, similar to FIG. 1.

FIG. 18 shows an example of such a temperature-compensated piezoelectric oscillator, and is the block diagram of the temperature-compensated piezoelectric oscillator according to another embodiment of the present invention. In the temperature-compensated piezoelectric oscillator 50, a variable power supply circuit 51 is different in construction from the variable power supply circuit 15 in FIG. 1, and the portion of the variable power supply circuit 51, different from that of the variable power supply circuit 15, is identical to that of the prior art temperature-compensated piezoelectric oscillator 200 in FIG. 24.

Specifically, the variable power supply circuit 51, as shown in FIG. 18, comprises an A/D converter 52 for converting a temperature-dependent voltage Vsens(T) coming in from a temperature sensor circuit 2 into digital temperature data, a data memory circuit 54 for outputting temperature characteristic compensating data corresponding to the digital temperature data, a D/A converter 53 for converting the temperature characteristic compensating data into a control voltage Vcont(T) and outputting it, and a temperature function supply voltage generator circuit 6 and an fO adjustment circuit 7, both identical to those in the variable power supply circuit 15 in FIG. 1.

Figure 19:
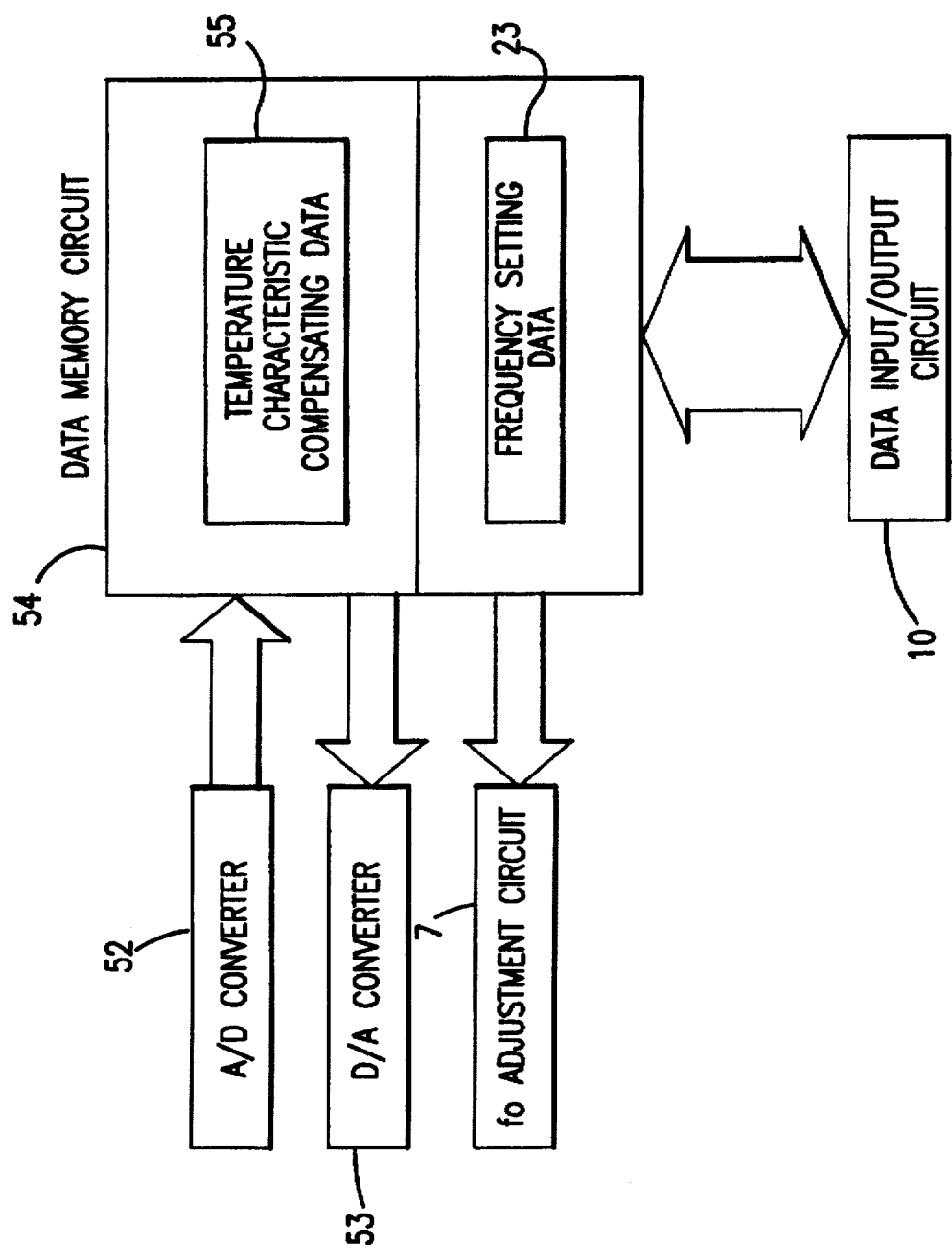
FIG. 19 is the diagram of the temperature-compensated piezoelectric oscillator of FIG. 18, similar to FIG. 5.
Figure 20:
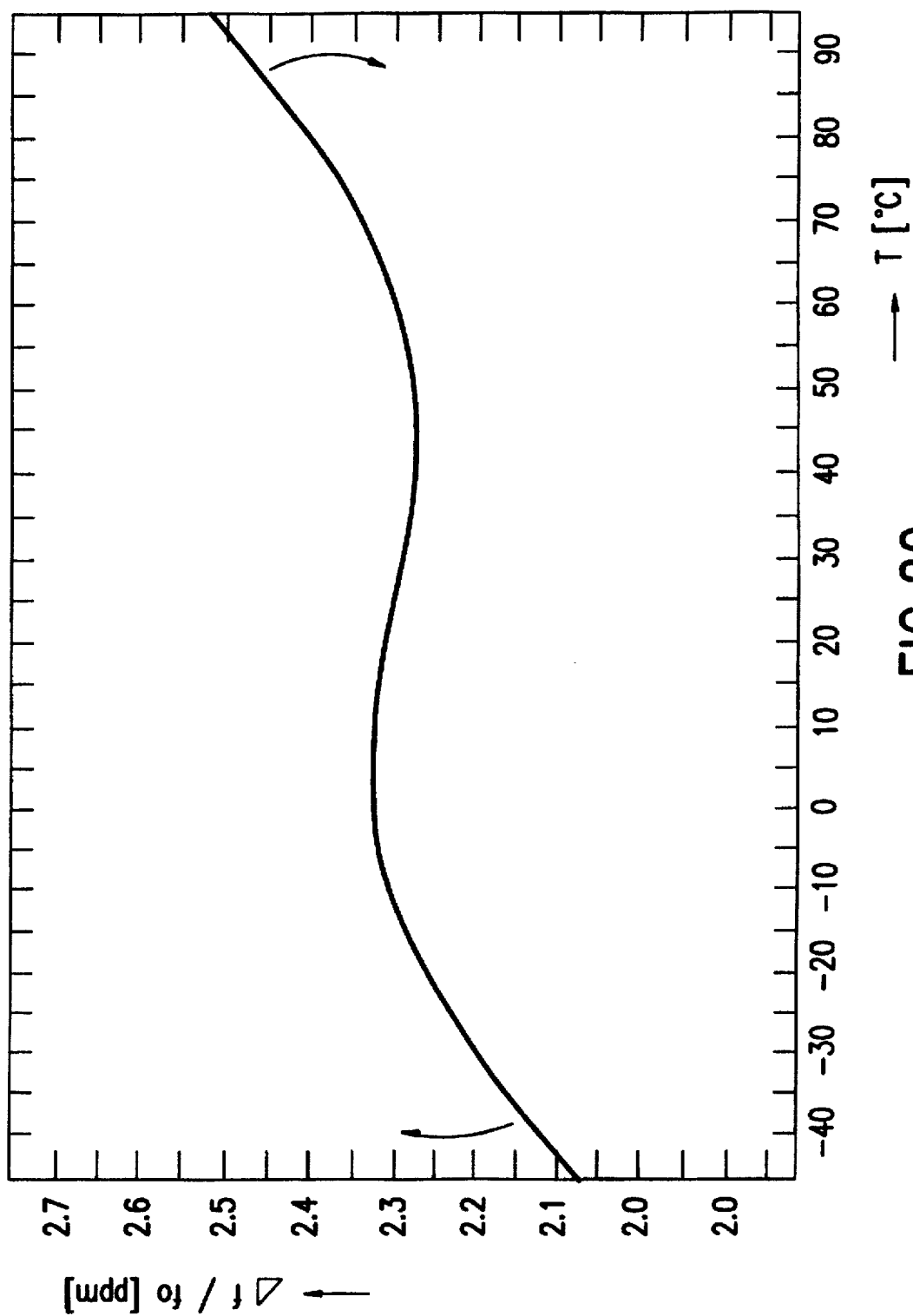
FIG. 20 is the diagram of the temperature-compensated piezoelectric oscillator of FIG. 18, similar to FIG. 3.

The data memory circuit 54, as shown in FIG. 19, stores the temperature characteristic compensating data 55 for modifying the frequency-temperature characteristics of the piezoelectric oscillator element 9 and frequency setting data 23 that is identical to that in the data memory circuit 4 in FIG. 5. The temperature characteristic compensating data 55 is constructed of juxtaposed compensation data with respect to the ambient temperature T arranged in an address corresponding to the temperature data coming in from the A/D converter 52, namely in an address corresponding to the sensed temperature from the temperature sensor circuit 2. The compensation data gives the value of the control voltage Vcont(T) at each ambient temperature T indicated by each address, and is set up so that, according to the frequency-temperature characteristic of the piezoelectric oscillator element 9 of the temperature-compensated piezoelectric oscillator 50, for example, as shown in FIG. 20, the frequency deviation Δf/fO is offset at each ambient temperature to be close to zero (in the directions of the arrows in the figure). The setting timing and procedure of these setting data 55 and 23 are identical to those of the offset setting data 21 in the temperature-compensated piezoelectric oscillator 1.

Figure 21:
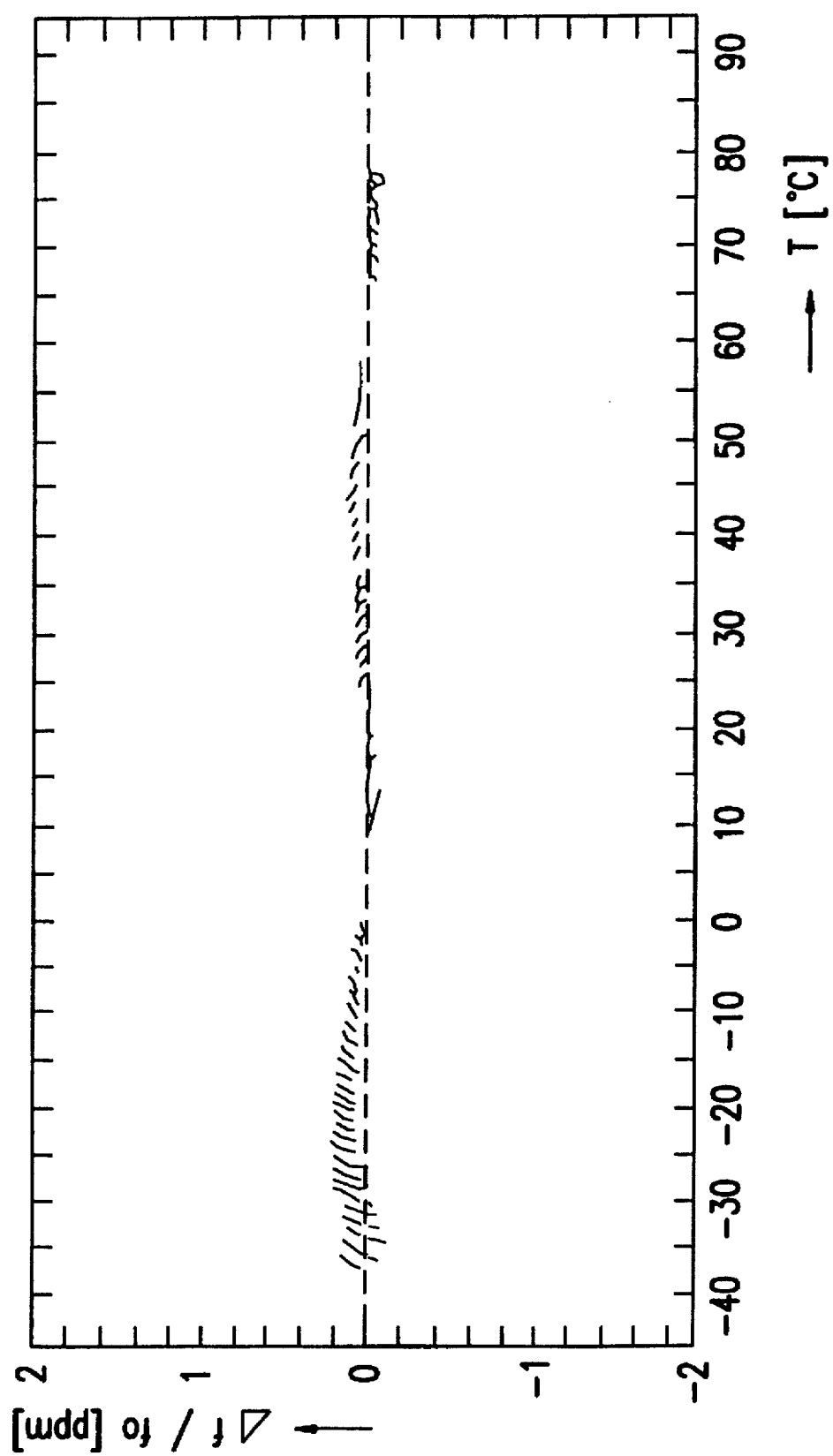
FIG. 21 is the diagram of the temperature-compensated piezoelectric oscillator of FIG. 18, similar to FIG. 14.
Figure 22A:
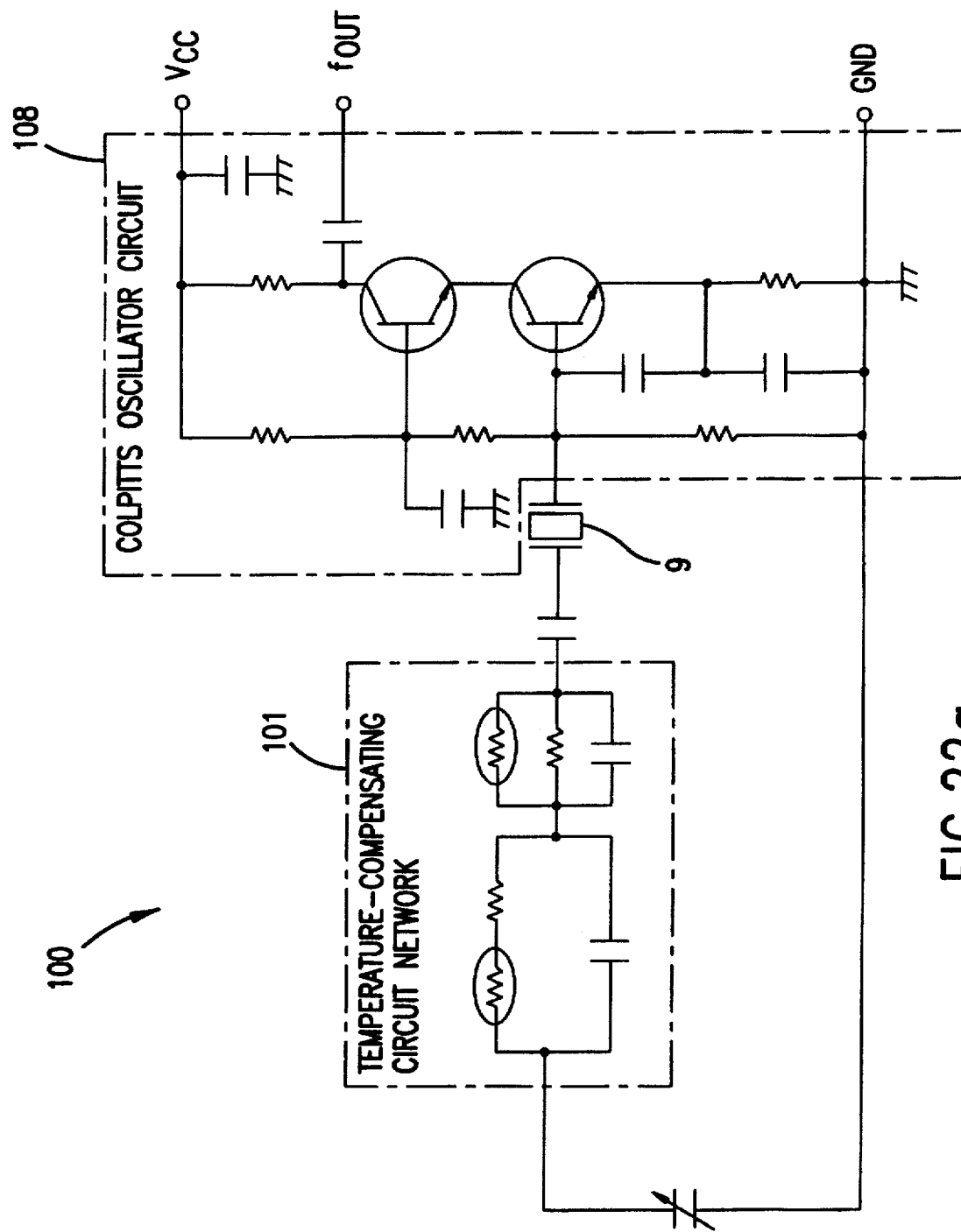
FIGS. 22(a) and 22(b) are the diagram showing the example of an analog temperature-compensated piezoelectric oscillator.
Figure 22B:
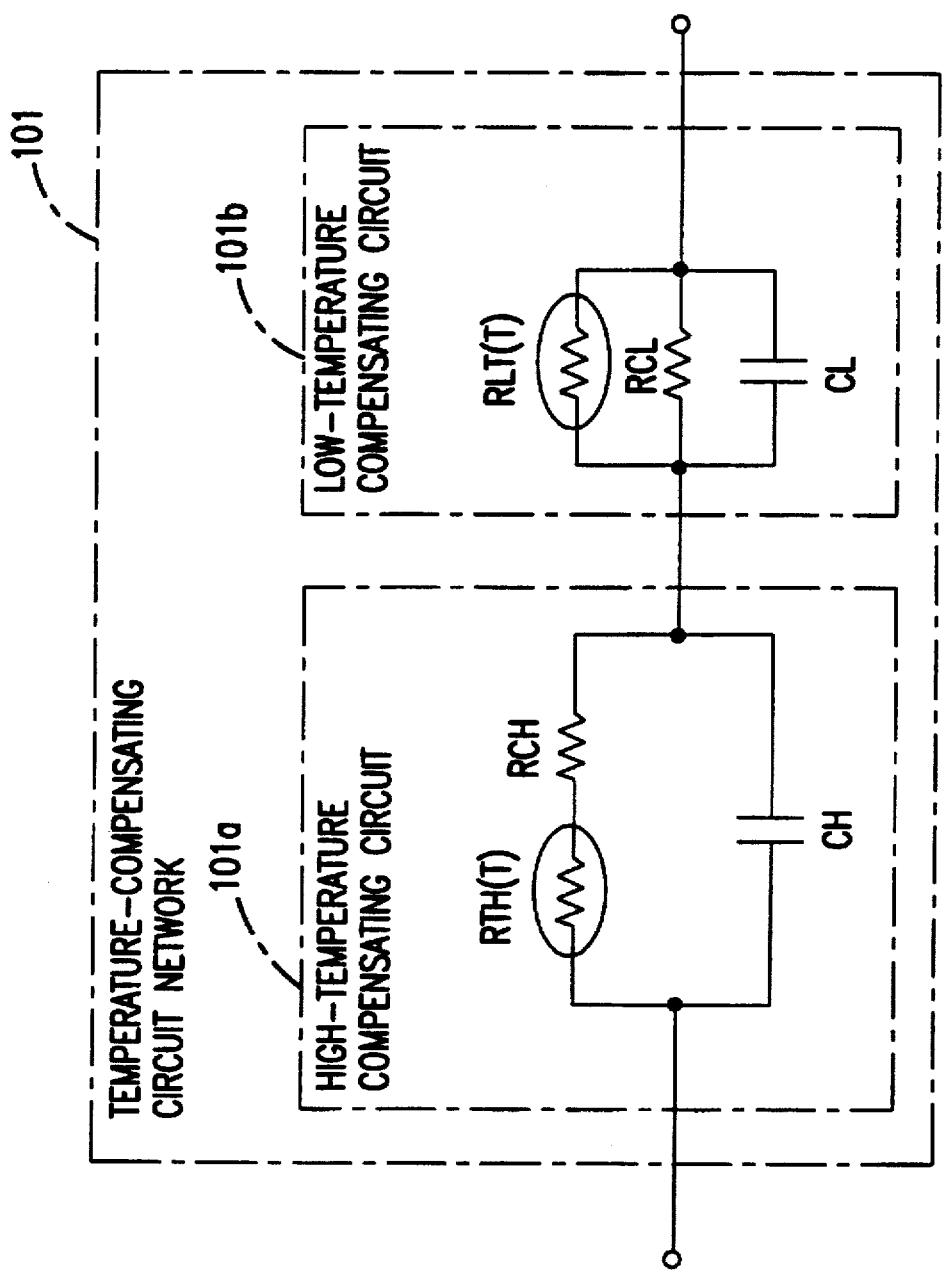
Figure 23:
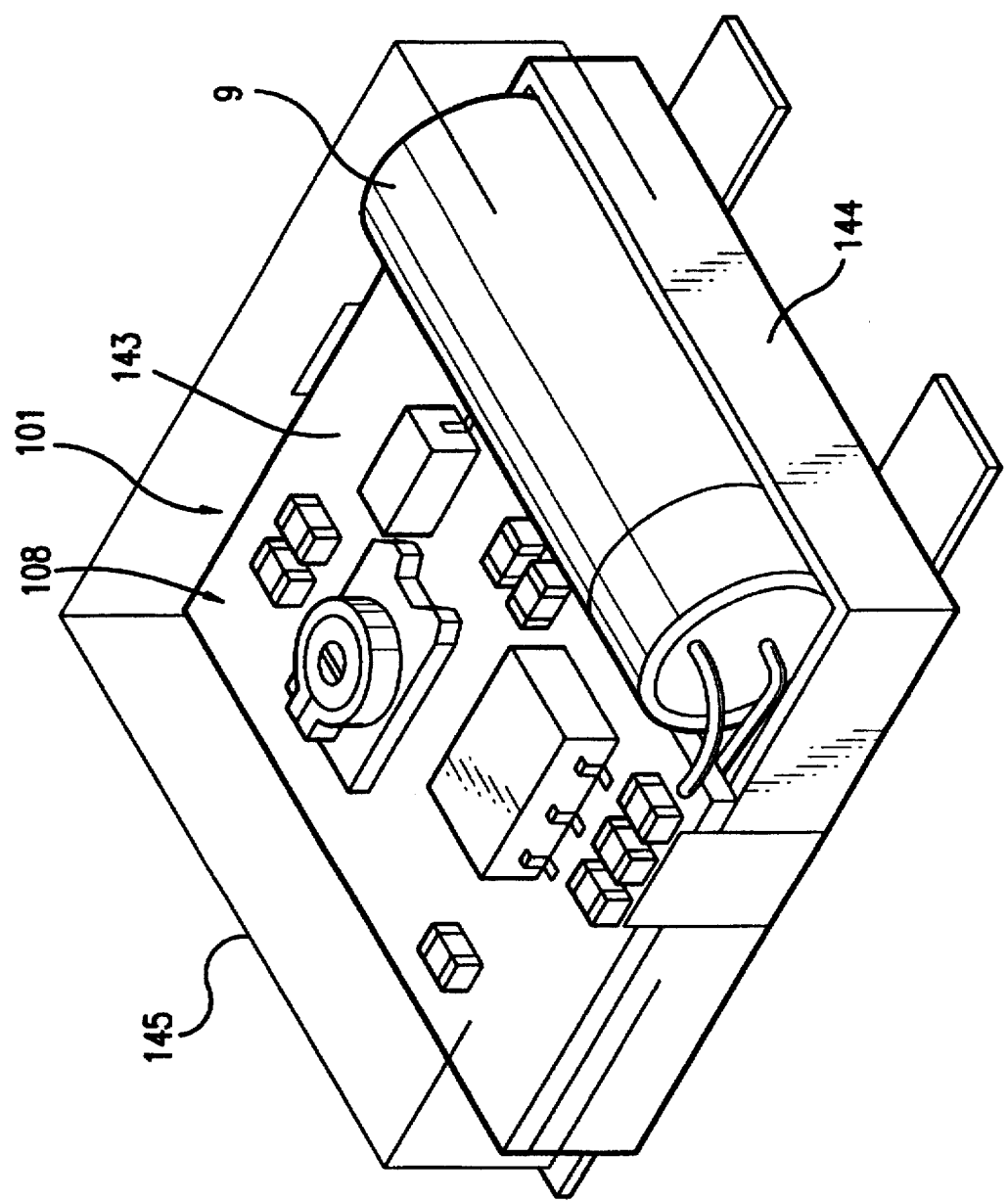
FIG. 23 is the perspective view showing the example of the construction of the temperature-compensated piezoelectric oscillator of FIG. 22.

In the variable power supply circuit 51, the compensation data is read from the data memory circuit 54 in response to the temperature-dependent voltage Vsens(T) of the temperature sensor circuit 2, the compensation data is converted into the control voltage Vcont(T) by the D/A converter 53, and the power supply voltage VDD(T) is varied by the temperature function supply voltage generator circuit 6 in response to the control voltage Vcont(T). The temperature-compensated piezoelectric oscillator 50 changes the reactance characteristic of the oscillator circuit 8 to offset the frequency-temperature characteristics of the piezoelectric oscillator element 9, and thus the frequency-temperature characteristics of the oscillator circuit 8 are varied. For example, the frequency-temperature characteristics of the piezoelectric oscillator element 9 in FIG. 20, namely a frequency deviation Δf/fO of approximately ±18 [ppm] within a temperature range of −40° C.~+80° C., are changed to the frequency-temperature characteristics in FIG. 21, namely ±0.3 [ppm] within the same temperature range.

The temperature-compensated piezoelectric oscillator 50 performs a high precision compensation within a range of ambient temperature T wider than in the temperature-compensated piezoelectric oscillator 1, by performing not only for the frequency deviation Δf/fO associated with the linear coefficient A of the piezoelectric oscillator element 9 but also for the frequency deviations associated with the quadratic coefficient B and the cubic coefficient C.

The present invention is not limited to the above-described embodiments, and may be embodied in a diversity of forms.

For example, the data memory circuits 4 and 54 may be constructed of electrically erasable type, ultraviolet erasable type, fuse type or the like, besides semiconductor memory like above-described EEPROM. The offset setting data 21 in the data memory circuit 4 and the temperature compensation data 55 in the data memory circuit 54 may be set in consideration of the shift quantity of the reference frequency fO due to variations among individual piezoelectric oscillator elements 9, and in this case, the frequency setting data 23 and the fO adjustment circuit 7 may be dispensed with. Although the fO adjustment circuit 7 is connected to the G (gate) side of the CMOS inverter 33 in FIG. 2, the reference frequency fO will be equally adjusted even if the fO adjustment circuit 7 is connected to the D (drain) side.

Any temperature sensor will be acceptable for use in the temperature sensor circuit 2 if it has a linear slope with respect to temperature, and, for example, the threshold voltage of a semiconductor, the forward voltage of a P-N junction or a thermistor may be used. Instead of the plastic mold 40, the temperature-compensated piezoelectric oscillator 1 or the temperature-compensated piezoelectric oscillator 50 may be entirely housed in a ceramic package and such oscillator 50 still equally offers miniaturization and mass production features. The above-described frequency-temperature characteristics and setting data are described by way of example only, and may be set in other form to achieve a desired frequency-temperature characteristic in consideration of the characteristics of a piezoelectric oscillator element, the construction of each circuit element, a manufacturing process and the like.

It is possible to modify the detail of the present invention without departing from the scope of the present invention.

Since, as described above, the temperature-compensated piezoelectric oscillator of the present invention compensates for the frequency-temperature characteristics by changing the power supply voltage of the oscillator circuit in response to the ambient temperature, the frequency-temperature characteristics are compensated for without the need for the installation of the external reactance element to the oscillator circuit, as would be required of the prior art, while the IC chip structure is easy to incorporate and the adjustment procedure after manufacture is facilitated. The advantage and the like offered by the construction of each claim are already quoted in the section of Means for Solving the Problem.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A temperature-compensated piezoelectric oscillator, comprising:

a piezoelectric oscillator element;

an oscillator circuit coupled to the piezoelectric oscillator element, the oscillator circuit oscillating at an oscillation frequency;

a temperature sensor circuit sensing a temperature of the piezoelectric oscillator element; and a variable power supply circuit coupled to the temperature sensor circuit and the oscillator circuit, the variable power supply circuit supplying a power supply voltage applied to the oscillator circuit based on an output of the temperature sensor circuit, wherein temperature dependent changes in the oscillation frequency of the oscillator circuit are compensated for by changing the power supply voltage, a frequency-temperature characteristic of the piezoelectric oscillator element being approximated by a function $$f(T)=A(T-25)+B(T-25)^2+C(T-25)^3,$$

where T is the temperature of the piezoelectric oscillator element, A is a linear coefficient, B is a quadratic coefficient and C is a cubic coefficient, and changes in the oscillation frequency of the oscillator circuit being compensated by temperature characteristic compensating data, the changes in the oscillation frequency corresponding to at least one of the linear coefficient A, the quadratic coefficient B and the cubic coefficient C.

2. The temperature-compensated piezoelectric oscillator of claim 1, wherein the frequency-temperature characteristic is changed by changing the power supply voltage applied to the oscillator circuit.

3. The temperature-compensated piezoelectric oscillator of claim 1, wherein the variable power supply circuit comprises:

data memory means for storing the temperature characteristic compensating data, the variable power supply circuit changing the power supply voltage applied to the oscillator circuit based on the output of the temperature sensor circuit and the temperature characteristic compensating data read from the data memory means.

4. The temperature-compensated piezoelectric oscillator of claim 1, wherein the temperature characteristic compensating data includes a coefficient G and a constant H, G and H defining a linear function $$V(T)=G(T)+H,$$

the variable power supply circuit changing the power supply voltage applied to the oscillator circuit so that the changes in the oscillation frequency of the oscillator circuit corresponding to the linear coefficient A is compensated based on the linear function V(T).

5. The temperature-compensated piezoelectric oscillator of claim 3, wherein an external data input device inputs at least the temperature characteristic compensating data to the data memory means of the temperature-compensated piezoelectric oscillator, the external data input device being external to the temperature-compensated piezoelectric oscillator.

6. The temperature-compensated piezoelectric oscillator of claim 3, wherein the variable power supply circuit compensates for a variation of a reference oscillation frequency of the piezoelectric oscillator element based on frequency setting data stored in the data memory means.

7. The temperature-compensated piezoelectric oscillator of claim 1, wherein the variable power supply circuit raises the power supply voltage applied to the oscillator circuit as the temperature sensed by the temperature sensor circuit rises.

8. The temperature-compensated piezoelectric oscillator of claim 1, wherein the variable power supply circuit, further comprises:

a limiter circuit that limits the power supply voltage applied to the oscillator circuit to a range.

9. The temperature-compensated piezoelectric oscillator of claim 8, wherein an upper limit of the range is set to a voltage that is lower than a power supply voltage of the temperature-compensated piezoelectric oscillator.

10. The temperature-compensated piezoelectric oscillator claim 8, wherein a lower limit of the range is set to a voltage that is higher than an oscillation cutoff voltage of the oscillator circuit.

11. The temperature-compensated piezoelectric oscillator of claim 1, wherein components of the temperature-compensated piezoelectric oscillator are integrated on an integrated circuit chip except for the piezoelectric oscillator element.

12. The temperature-compensated piezoelectric oscillator of claim 11, wherein the integrated circuit chip and the piezoelectric oscillator element is packaged into a mold.

13. The temperature-compensated piezoelectric oscillator of claim 11, wherein the integrated circuit chip and the piezoelectric oscillator element is housed in a package.

14. The method of claim 1, wherein the temperature characteristic compensating data includes a coefficient G and a constant H, G and H defining a linear function $$V(T)=G(T)+H,$$

the variable power supply circuit changing the power supply voltage applied to the oscillator circuit so that the changes in the oscillation frequency of the oscillator circuit corresponding to the linear coefficient A is compensated based on the linear function V(T).

15. A method for temperature-compensating a piezoelectric oscillator that includes a piezoelectric oscillator element coupled to an oscillator circuit, comprising:

sensing a temperature using a temperature sensor circuit; and changing a power supply voltage applied to the oscillator circuit of the piezoelectric oscillator with a variable power supply circuit coupled to the temperature sensor circuit and the oscillator circuit, the power supply voltage being changed based on an output of the temperature sensor circuit to compensate for temperature dependent changes in an oscillation frequency of the oscillator circuit, wherein temperature compensating data compensates for changes in the oscillation frequency of the oscillator that corresponds to at least one of a linear coefficient A, a quadratic coefficient B and a cubic coefficient C of a function $$f(T)=A(T-25)+B(T-25)^2+C(T-25)^3$$

that approximates a frequency-temperature characteristic of the piezoelectric oscillator element, where T is the temperature of the piezoelectric oscillator element.

16. The method of claim 15, wherein the changing step changes the temperature-frequency characteristic of the piezoelectric oscillator by changing the power supply voltage applied to the oscillator circuit.

17. The method of claim 15, further comprising:
storing the temperature characteristic compensating data in data memory means; and
reading the temperature characteristic compensation data from the data memory means with the variable power supply circuit, the changing step changing the power supply voltage applied to the oscillator circuit based on the output of the temperature sensor circuit and the temperature characteristic compensation data.

18. The method of claim 17, wherein the variable power supply circuit compensates for a variation of a reference oscillation frequency of the piezoelectric oscillator element based on frequency setting data stored in the data memory means.

* * * * *